(12) United States Patent
Dutta et al.

(10) Patent No.: US 8,739,103 B1
(45) Date of Patent: May 27, 2014

(54) TECHNIQUES FOR PLACEMENT IN HIGHLY CONSTRAINED ARCHITECTURES

(71) Applicant: Cypress Semiconductor Corporation, San Jose, CA (US)

(72) Inventors: Avijit Dutta, San Jose, CA (US); Robert Thompson, Tualatin, OR (US); Krishnan Anandh, San Jose, CA (US); Joseph Skudlarek, Lake Oswego, OR (US); Andrew Price, Seattle, WA (US); Neil Tuttle, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/050,105

(22) Filed: Oct. 9, 2013

Related U.S. Application Data

(60) Provisional application No. 61/772,398, filed on Mar. 4, 2013.

(51) Int. Cl.
*G06F 17/50* (2006.01)

(52) U.S. Cl.
USPC .......... 716/119; 716/111; 716/117; 716/118; 716/122; 716/132; 716/136

(58) Field of Classification Search
USPC .......... 716/111, 117, 118, 119, 122, 132, 136
See application file for complete search history.

(56) References Cited

U.S. PATENT DOCUMENTS

| | | | | |
|---|---|---|---|---|
| 5,537,328 | A * | 7/1996 | Ito | 716/120 |
| 5,537,341 | A * | 7/1996 | Rose et al. | 716/104 |
| 5,596,742 | A * | 1/1997 | Agarwal et al. | 326/37 |
| 5,633,806 | A * | 5/1997 | Yusa et al. | 326/37 |
| 5,761,484 | A * | 6/1998 | Agarwal et al. | 326/38 |
| 5,838,583 | A * | 11/1998 | Varadarajan et al. | 716/123 |
| 6,430,730 | B1 * | 8/2002 | Ghatate et al. | 716/134 |
| 6,526,558 | B2 * | 2/2003 | Agrawal et al. | 716/117 |
| 7,051,313 | B1 * | 5/2006 | Betz et al. | 716/113 |
| 7,062,744 | B2 * | 6/2006 | Osann | 716/106 |
| 7,129,747 | B1 * | 10/2006 | Jang et al. | 326/38 |
| 7,210,115 | B1 * | 4/2007 | Rahim et al. | 716/113 |
| 7,669,151 | B1 * | 2/2010 | Boyle et al. | 716/115 |
| 7,730,437 | B1 * | 6/2010 | Ramakrishnan et al. | 716/113 |

(Continued)

OTHER PUBLICATIONS

Chau, S.; "Fault injection boundary scan design for verification of fault tolerant systems"; Publication Year: 1994; Test Conference, 1994. Proceedings., International; pp. 677-682.*

(Continued)

*Primary Examiner* — Helen Rossoshek

(57) ABSTRACT

Techniques for placement in highly constraint chip architectures are described herein. In an example embodiment, a computer system places a digital portion of an electronic design for a programmable chip. The programmable chip comprises multiple fixed-function blocks and a plurality of pins, where each one of the multiple fixed-function blocks can be coupled only to a respective subset of the plurality of pins. The electronic design comprises a particular fixed-function block (FFB) instance that is connected to a particular input-output (IO) instance. The computer system places (e.g., by using a backtracking search) the particular FFB instance on a particular fixed-function block and the particular IO instance on a particular pin from a particular subset of the plurality of pins, where in the programmable chip the particular fixed-function block can be coupled only to the particular subset of the plurality of pins.

20 Claims, 8 Drawing Sheets

(56) References Cited

U.S. PATENT DOCUMENTS

| | | | | |
|---|---|---|---|---|
| 7,895,560 | B2* | 2/2011 | Lovell | 716/119 |
| 7,930,668 | B1* | 4/2011 | Parsa | 716/126 |
| 7,965,102 | B1* | 6/2011 | Bauer et al. | 326/41 |
| 8,069,428 | B1* | 11/2011 | Ogami et al. | 716/117 |
| 2006/0230377 | A1* | 10/2006 | Rapp et al. | 716/18 |
| 2010/0169857 | A1* | 7/2010 | Campi et al. | 716/8 |

OTHER PUBLICATIONS

Franchi et al.; "Analog synthesis of nonlinear functions based on fuzzy logic"; Publication Year: 1998; Solid-State Circuits, IEEE Journal of vol. 33 , Issue: 6; pp. 885-895; Cited by: Papers (8)*

A.Marquardt, V. Betz, and J.Rose."Using Cluster-Based Logic Blocks and Timing-Driven Packing to Improve FPGA Speed and Density", in Proceeding of the 1999 ACM/SIGDA Seventh International Symposium on Field Programmable Gate Arrays, 1999, pp. 37.46.

B.S. Landman and R.L. Russo. On a Pin Versus Block Relationship for Partitions of Logic Graphs:, IEEE Trans. on Computers, C-20; 1469-1479, 1971.

M.J. Alexander, J.p. Cohoon, J.L. Ganley, and G.Robbins."An Architecture—Independent Approach to FPGA Routing Based on Multi-Weighted Graphs" in EDAC, pp. 259-264 Sep. 1994.

V.Betz and J.Rose."Vpr: A New Packing, Placement and Routing Tool for FPGA Research", In 7th Int. Workshop on Field-Programmable Logic Applications, pp. 213-222, 1997.

* cited by examiner

US 8,739,103 B1

TECHNIQUES FOR PLACEMENT IN HIGHLY CONSTRAINED ARCHITECTURES

PRIORITY

This application claims the priority and benefit of U.S. Provisional Application No. 61/772,398 filed on Mar. 4, 2013, the entire contents of which are incorporated by reference herein.

TECHNICAL FIELD

This disclosure relates to the field of Electronic Design Automation (EDA).

BACKGROUND

Field-Programmable Gate Arrays (FPGAs) and Programmable Logic Devices (PLDs) have been used in data communication and telecommunication systems. Conventional PLDs and FPGAs consist of an array of digital blocks, with the blocks programmed to implement a function or equation by processing digital signals. Some currently-available Complex PLD (CPLD) products may comprise arrays of logic cells. During placement of an electronic design on such devices, a conventional EDA program (tool) can place the component instances of the design anywhere on the chip because such devices (e.g., FPGAs, PLDs, CPLDs) typically provide connectivity from any digital block to any input-output (IO) pin over substantially symmetric interconnects. Further, since in such devices there are no physical restrictions on where digital block instances and IO instances can be placed, the placer of a conventional EDA program typically tries to find the optimal placement in order to obtain a certain benefit such as the least timing delay or the lowest power consumption.

However, the placers of conventional EDA programs do not work well (if at all) for highly constrained chip architectures that have physical restrictions on the connectivity between digital blocks and IO pins. For example, conventional EDA programs may consume a lot of computing resources (e.g., memory, CPU time, etc.) and may take a long time (or even fail) when trying to find a placement solution for an electronic design on a programmable chip architecture in which the locations of at least some digital blocks are interdependent with the locations of IO pins. This is not the least because the placers in conventional EDA programs treat the placement of IO pins and the placement of digital blocks as separate placement tasks that are performed separately and independently of each other (typically, with IO pins being placed first) and often by using separate placement algorithms.

The above deficiencies of conventional EDA programs with respect to highly constrained chip architectures are exacerbated further since the ever-increasing size and complexity of electronic designs typically lead to less efficient placements, which in turn cause less efficient use of processing resources by the target chips during operation.

DETAILED DESCRIPTION

Figure 1A:
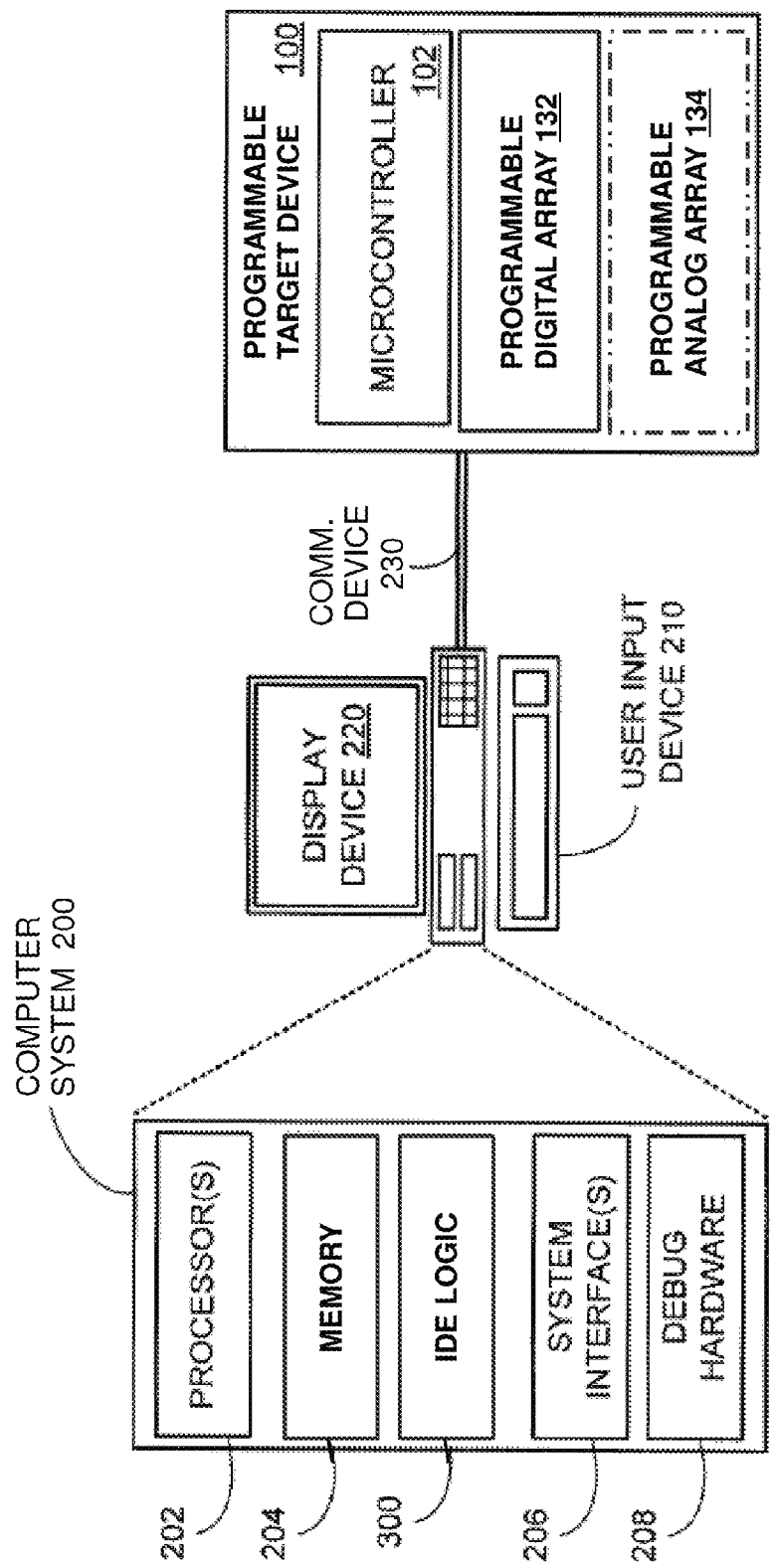
FIG. 1A illustrates an example operational context in which embodiments may be implemented.

The following description sets forth numerous specific details such as examples of specific systems, components, methods, and so forth, in order to provide a good understanding of various embodiments of the techniques for placement of electronic designs in highly constrained chip architectures that are described herein. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

References in the description to "an embodiment", "one embodiment", "an example embodiment", "some embodiments", and "various embodiments" mean that the particular feature, structure, or characteristic being referred to is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

In various embodiments, the placement techniques described herein may comprise one or more methods that are executed by one or more computer systems or computing devices. Although the operations of such method(s) are shown and described hereinafter in a particular order, the operations of each method may be altered so that certain operations may be performed in a different order or so that certain operation(s) may be performed, at least in part, concurrently and/or in parallel with other operations. In other embodiments, instructions or sub-operations of distinct operations may be executed in an intermittent and/or alternating manner. Thus, the various method embodiments of the described techniques, as well as the order of operations therein, are to be regarded in an illustrative rather than a restrictive sense.

Overview

As used herein, "target device", "programmable device" and "programmable target device" refer to a device that includes programmable components (e.g., macrocells, programmable digital blocks, programmable analog blocks, etc.) as well as one or more interconnects (e.g., such as a digital interconnect) with hardware components (e.g., such as switches, multiplexers, hubs, buses, etc.) that can be programmed and/or re-programmed by firmware configuration (e.g., such as software and/or hardware configuration files) that is installed on the device. Examples of such programmable devices include programmable chips such as systems-on-chip, processors, microcontrollers, FPGAs, PLDs, CPLDs, or other processing devices that have programmable hardware components. A programmable device includes various functional blocks that are built from various analog and digital circuitry elements to perform various functions. One example of a functional block is a fixed-function block ("FFB","ffb"). A fixed-function block is a set of circuitry elements, which is hardwired (e.g., built onto a chip) to perform a specific function and which is physically positioned at a fixed location (e.g., a fixed area on the chip).

As used herein, "electronic design" refers to a dataset representing physical electronic components and/or hardware circuitry that can perform certain specified functionalities in a programmable target device. In some embodiments, the placement techniques described herein may be implemented for a mixed-signal electronic design having an analog portion (with analog components through which analog signals can be routed) and a digital portion (with digital components through which digital signals can be routed). In some embodiments, the techniques described herein may be implemented for an electronic design that has a predominant analog portion with a few digital components (e.g., such as timers, counters, and various communication blocks). In other embodiments, the techniques described herein may be implemented for an electronic design that has a predominant digital portion with a few analog components that form analog routes (e.g., such as components that convert analog signals to digital signals).

An electronic design may be represented by and stored as a collection of netlists, where each netlist comprises lists of instances that are connected in nets. As used herein, "netlist" refers to one or more data structures that store data describing the component(s), their connections to each other, and other properties of the circuitry of an electronic design; "net" refers to one or more data structures that store the connection(s) that connect one or more components and/or the terminals or pins thereof. "Instance" refers to a data object that represents a physical component in a netlist; an instance has a definition, specific attributes, and characteristics (e.g., name, type, input parameters, output parameters, etc.) of the component that it represents. One example of a component instance is a FFB instance, which is a data object that represents a fixed-function block that can perform a specific function. Another example of a component instance is an input-output (IO) instance, which is a data object that represents an IO pin of a target device. As used herein, "IO pin" and "pin" refer to a terminal of a programmable device though which the device can be coupled to off-device elements and can receive and transmit signals into and out of on-device elements. For example, a pin of a programmable chip typically corresponds to a pin, on the chip's package, that is wired (e.g., on a printed circuit board, or PCB) to get signals to and from the chip.

To address the deficiencies of conventional EDA programs with respect to placement on highly constrained chip architectures, the techniques described herein provide for solving the placement problem in an efficient way that factors in the architectural constraints and effectively/smartly prunes the solution space for a fast placement solution. For example, in some embodiments, the techniques described herein introduce a novel variant of a backtracking search that handles the interdependencies between fixed-function blocks and IO pins, which exist on highly constrained chip architectures, by automatically and simultaneously placing the IO instances and the FFB instances of an electronic design. The techniques described herein also introduce an efficient implication look-ahead search (to reduce the complexity of the backtracking search) and conflict learning in the context of IO and FFB instance placement (to enable early backtracking). The techniques described herein also introduce three different pre-search ordering heuristics to greatly reduce search complexity and to improve the performance of the placer logic during runtime, as well as heuristics to backtrack out-of-order in a pseudo-exhaustive manner in order to reduce the search time for hard-to-find placement solutions or when no placement solution exists.

In an example embodiment of the techniques described herein, a computer system places a digital portion of an electronic design for a programmable chip. The programmable chip comprises multiple fixed-function blocks and a plurality of pins, where each one of the multiple fixed-function blocks can be coupled only to a respective subset of the plurality of pins. The electronic design comprises a particular FFB instance that is connected to a particular IO instance. The computer system places the particular FFB instance on a particular fixed-function block and the particular IO instance on a particular pin from a particular subset of the plurality of pins, where in the programmable chip the particular fixed-function block can be coupled only to the particular subset of the plurality of pins. In some aspects of this embodiment, the computer system places the FFB instances and the IO instances of the digital portion of the electronic design simultaneously—that is, the computer system pools the FFB instances and the IO instances into a group of instances, and then places the instances in the group by using the same backtracking search.

In other embodiments, the techniques for placement of electronic designs described herein may be embodied as a set of instructions that are stored on non-transitory computer-readable storage media. Such instructions, when executed by one or more processors of a computer system, cause the one or more processors to perform the techniques described herein. In yet other embodiments, the techniques described herein may be embodied as an apparatus comprising one or more processors and non-transitory media that stores a set of instructions. The set of instructions, when executed by the one or more processors, causes the apparatus to perform the techniques described herein.

Examples of Operational Contexts, Programmable Target Devices, and Design Automation Flows FIG. 1A illustrates an example operational context in which embodiments of the placement techniques described herein may be implemented.

Referring to FIG. 1A, an exemplary programmable target device 100 is configured and/or programmed by computer system 200. Programmable target device 100 includes microcontroller 102 and configurable hardware components, such as programmable array of digital blocks 132 and possibly programmable array of analog blocks 134. The programmable target device 100 also includes other hardware components—such as general purpose IO (GPIO) components, special functions array(s), etc.—that provide a set of digital fixed-function blocks. Microcontroller 102 can be programmed (and re-programmed) and the programmable digital and analog arrays 132 and 134 can be configured (and reconfigured) to implement various applications and to perform a variety of functions.

An exemplary computer system 200 may be configured and/or programmed to execute processing logic that is configured and operable to perform the described placement techniques. As used herein, "logic" refers to a set of instructions which, when executed by one or more processors, are configured and operable to perform one or more functionalities. In various embodiments and implementations, any such logic may be implemented as one or more software components that are executable by one or more processors (e.g., such as central processing units, or CPUs), as one or more hardware components (e.g., such as Application-Specific Integrated Circuits, or ASICs), or as any combination of one or more software and hardware components. For example, any particular logic may be implemented, without limitation, as a standalone and/or client-server software application, as one or more software modules, as one or more libraries of functions, as one or more dynamically linked libraries, as one or more active X controls, and/or as one or more browser plug-ins. Further, in various embodiments the functionalities of any particular logic may be implemented in the same integrated module or may be combined in two or more modules that may provide some additional functionality. When executed on a computer system or in a distributed computing environment, a particular logic may be embodied as one or more computer processes, threads, or any other run-time entities that are allocated computing resources (e.g., such as memory, CPU time, storage space, and network bandwidth) to perform the logic's functionalities.

As illustrated in FIG. 1A, computer system 200 is configured to execute integrated development environment (IDE) logic 300, allowing for unified hardware and software development and for configuration of programmable target device 100 with hardware configuration files and software programming. Computer system 200 can include one or more processors 202 to execute IDE logic 300, for example, by executing instructions stored in memory 204 or in other computer-readable volatile and/or non-volatile storage media.

After hardware configuration files and software programming are generated, computer system 200 can program and/or configure programmable target device 100 with the developed hardware configuration and software programming, for example, through communication device 230. In some embodiments, device 230 can be a wired device, such as a Universal Serial Bus (USB) device, network interface card (e.g., such as Ethernet card), and the like, or it can be a wireless communication device that can establish a wireless link between computer system 200 and programmable target device 100.

Computer system 200 may also include system interface(s) 206 that allow the computer system to communicate with external devices, such as user input device 210, display device 220, and programmable target device 100. For example, computer system 200 may include a system interface 206 to communicate with programmable target device 100 over communication device 230. In some embodiments, system interface(s) 206 can receive inputs, for example, through input device 210, and present information, for example, via display device 220.

Computer system 200 and/or IDE logic 300 can generate hardware configuration and/or software applications for programmable target device 100 in response to user input, for example, from input device 210. IDE logic 300 can include various development tools and/or EDA programs that allow system designers to describe electronic designs for programmable target device 100, and to implement and provide software or firmware code for microcontroller 102. In some embodiments, IDE logic 300 can receive hardware description code that describes the hardware circuitry of an electronic design in an abstracted or generic manner, and can convert the generic code into device-specific configuration files that are particular to the architecture and/or resources (e.g., interconnects and other routing resources) of programmable target device 100. The hardware description code provided by the system designers may include schematic circuit diagrams and/or hardware code written according to a hardware description language, such as Verilog or VHDL.

Computer system 200 and/or IDE logic 300 can also generate application programming interfaces (APIs) based, at least in part, on the hardware description code. These APIs, when provided to programmable target device 100, can program microcontroller 102 to communicate with programmable digital and analog arrays 132 and 134, and with any other special function arrays and GPIO components, that are configured according to the device-specific configuration files.

Computer system 200 and/or IDE logic 300 can send the device-specific configuration files and the application programming interfaces to programmable target device 100. Programmable target device 100 can utilize the configuration files to configure particular hardware components in the programmable digital and/or analog arrays 132 and 134, and in any other special function arrays and GPIO components, to implement the hardware circuitry described by the hardware description code. Programmable target device 100 can utilize the application programming interfaces to program the microcontroller 102 to communicate with the programmable digital and/or analog arrays 132 and 134, and with any other special function arrays and GPIO components, that are configured according to the device-specific configuration files.

After programmable target device 100 has been programmed with the hardware configuration and software/firmware programming developed with IDE logic 300, computer system 200 can execute debug hardware 208 to perform debugging operations on programmable target device 100. In some embodiments, debug hardware 208 can be located externally from computer system 200 and can communicate with the computer system via a system interface 206.

In various embodiments, a computer system such as computer system 200 may execute instructions to configure (and re-configure) various programmable target devices. Examples of such programmable devices include, but are not limited to, various programmable chips such as systems-on-chip and other systems that include one or more processors, microcontrollers, FPGAs, PLDs, CPLDs, or other processing devices that have configurable hardware components.

One example of a programmable system-on-chip is a device from the Programmable System-on-Chip (PSoC™) family of products offered by Cypress Semiconductor Corporation of San Jose, Calif., where such device is manufactured on a single integrated circuit (IC) die. A computer system, such as computer system 200, can execute processing logic that allows designers to develop applications for and program both the configurable hardware components and the microcontroller of the PSoC™ device.

Figure 1B:
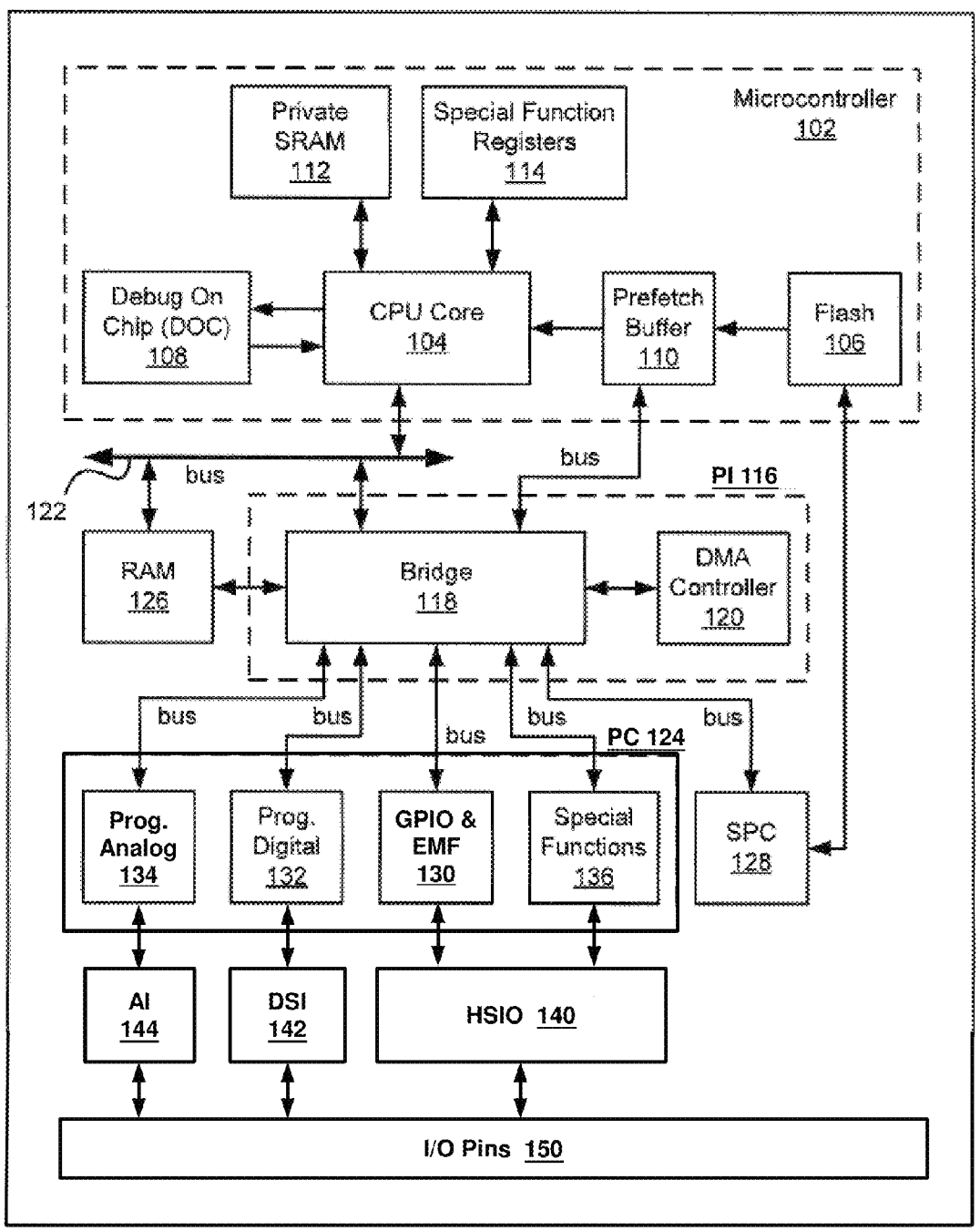
FIG. 1B is a block diagram illustrating an example programmable target device for which various embodiments may be implemented.

FIG. 1B illustrates an example embodiment of a programmable system-on-chip device 101. In some embodiments, a system-on-chip device (e.g., such as device 101) is manufactured as a set of integrated circuits on a die of semiconductor material. Device 101 includes microcontroller 102. Microcontroller 102 includes CPU core 104 (which may include one or more processors), flash program storage 106, DOC (Debug-On-Chip) 108, prefetch buffer 110, private SRAM (Static Random Access Memory) 112, and special functions registers 114. In an embodiment, DOC 108, prefetch buffer 110, private SRAM 112, and special function registers 114 may be coupled to CPU core 104, while flash program storage 106 may be coupled to prefetch buffer 110. Flash program storage 106 can be any type of program memory.

Device 101 may also include peripheral interconnect (PI) 116, which may include bridge 118 (e.g., such as a single-level or multi-level Advanced High-Performance Bus Bridge) and optionally a DMA (Direct Memory Access) controller 120 that is coupled to microcontroller 102 via bus 122. Peripheral interconnect 116 may provide the primary data and control interface between microcontroller 102 and its peripherals and memory, and programmable core (PC) 124. DMA controller 120, when present, may be programmed to transfer data between system elements without burdening CPU core 104. In various embodiments, each of these sub-components of microcontroller 102 and peripheral interconnect 116 may be different with each choice or type of CPU core 104. Optionally, peripheral interconnect 116 may also be coupled to shared SRAM 126 and SPC (System Performance Controller) 128. Private SRAM 112 is independent of the shared SRAM 126, which is accessed by microcontroller 102 through bridge 118. CPU core 104 accesses the private SRAM 112 without going through bridge 118, thus allowing local register and RAM accesses to occur simultaneously with DMA access to shared SRAM 126. Although labeled here as SRAM, these memory modules may be any suitable type of a wide variety of (volatile or non-volatile) memory or data storage modules in various other embodiments.

In various embodiments and implementations, programmable core 124 may include various combinations of sub-components (not shown), including, but not limited to, global routing channels, digital processing channels, digital peripherals, analog processing channels, analog peripherals, DMA controller(s), SRAM and other appropriate types of data storage, IO ports, and other suitable types of subcomponents. In the example embodiment illustrated in FIG. 1A, programmable core 124 includes GPIO (General Purpose IO) and EMIF (Extended Memory Interface) blocks 130 to provide a mechanism to extend the external off-chip access of microcontroller 102, programmable digital array 132, programmable analog array 134, and special functions array 136, each configurable and/or programmable to implement one or more of the subcomponent functions. Programmable digital array 132 is coupled to digital system interface (DSI) 142, which provides the digital blocks in array 132 with fully-routable connectivity to IO pins 150. Programmable analog array 134 is coupled to analog interface (AI) 144, which provides analog components of array 134 with routable connectivity to IO pins 150. GPIO blocks 130 are coupled to high-speed I/O (HSIO) matrix 140, which provides constrained connectivity to input/output (IO) pins 150. Special functions array 136 is coupled to HSIO matrix 140, which provides the blocks (e.g., such as fixed-functions blocks) of array 136 with constrained connectivity to IO pins 150.

Programmable digital array 132 may include an array of digital logic blocks, where digital interconnect 142 provides fully-routable connectivity between any digital block in the array and any of the IO pins 150. In one embodiment, the digital block architecture is comprised of UDBs (Universal Digital Blocks). For example, each UDB may include an ALU (Arithmetic Logic Unit) together with a CPLD (Complex PLD) or other types of digital programmable logic elements. Digital interconnect 142 includes a series of components (e.g., buses, switches, etc.) that provide interconnectivity amongst the digital logic blocks (e.g., to allow digital blocks, banks of blocks, and digital channels to be connected to each other, to internal and external reference signals, to mixed-signal blocks, etc.) and that allow signals from any digital block to be routed to any of IO pins 150.

In various embodiments, one or more UDBs of programmable digital array 132 may be configured to perform various digital functions, including, but not limited to, one or more of the following functions: a basic $I^2C$ slave; an $I^2C$ master; a SPI (Serial Peripheral Interface) master or slave; a multi-wire (e.g., 3-wire) SPI master or slave (e.g., MISO/MOSI multiplexed on a single pin); timers and counters (e.g., a pair of 8-bit timers or counters, a 16-bit timer or counter, a 8-bit capture timer, or the like); pulse-width modulators, or PWMs (e.g., a pair of 8-bit PWMs, a 16-bit PWM, a 8-bit deadband PWM, or the like); a level sensitive I/O interrupt generator; a quadrature encoder; an Universal Asynchronous Receiver/Transmitter, or UART (e.g., half-duplex); delay lines; and any other suitable type of digital function or combination of digital functions which can be implemented in one or more UDBs.

In other embodiments, additional functions may be implemented using a group of two or more UDBs. Merely for purposes of illustration and not limitation, the following functions may be implemented using multiple UDBs: an $I^2C$ slave that supports hardware address detection and the ability to handle a complete transaction without CPU core intervention and to help prevent the force clock stretching on any bit in the data stream; an $I^2C$ multi-master which may include a slave option in a single block; an arbitrary length cyclical redundancy check, or CRC (e.g., up to 32 bits); secure digital input/output, or SDIO; serial general purpose input/output, or SGPIO; a digital correlator (e.g., having up to 32 bits with 4× over-sampling and supporting a configurable threshold); a LIN (Local Interconnect Network) bus interface; a delta-sigma modulator (e.g., for class D audio DAC having a differential output pair); an integrated interchip sound, or $I^2S$ (stereo); a liquid crystal display, or LCD, drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support); a capture timer (e.g., 16-bit or the like); a deadband PWM (e.g., 16-bit or the like); a system management bus, or SMbus (including formatting of SMbus packets with CRC in software); a brushless motor drive (e.g., to support 6/12 step commutation); auto BAUD rate detector and generator (e.g., automatically determine BAUD rate for standard rates from 1200 to 115200 BAUD and after detection to generate required clock to generate BAUD rate); and any other suitable type of digital function or combination of digital functions which can be implemented in multiple UDBs.

Programmable analog array 132 may include an array of analog components, where analog interconnect 144 provides routable connectivity between the analog components and the IO pins 150. Programmable analog array 134 may include analog components including, but not limited to, comparators, mixers, PGAs (Programmable Gain Amplifiers), TIAs (Trans-Impedance Amplifiers), ADCs (analog-to-digital converters), DACs (digital-to-analog converters), voltage references, current sources, sample and hold circuits, interconnects (and switches thereof), and any other suitable type of analog components and resources. Programmable analog array 134 may support various analog functions including, but not limited to, analog routing, LCD drive IO support, capacitive sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function. Analog interconnect 144 includes a series of buses, switches and multiplexers that are interwoven amongst the analog components, which allows analog blocks, banks of blocks, and channels to be connected to each other, to internal and external reference signals, to mixed-signal blocks (e.g., such as DACs), as well as to IO pins 150.

In some embodiments, GPIO blocks 130 may include one or more fixed-function blocks. An example of a GPIO block is a serial communication block (SCB). In some embodiments, a SCB may include various circuitry elements that are coupled to implement a serial communication interface (e.g, such as $I^2C$), a universal asynchronous receiver/transmitter (UART), or a serial peripheral interface (SPI). An SCB may be a fixed-function block that provides functions such as, for example, a standard $I^2C$ multi-master and slave, a standard SPI master and slave, a standard UART transmitter and receiver, and a function mode support for SPI and $I^2C$ with 32-byte buffer. At least some of the GPIO blocks 130 have constrained (limited) connectivity to IO pins 150—for example, at least some GPIO blocks can connect to some (e.g., one, two, and/or three), but not all, of IO pins 150.

In some embodiments, special functions array 136 may include dedicated (non-programmable) fixed-function blocks and/or one or more interfaces to dedicated functional blocks, such as a USB, a crystal oscillator drive, a JTAG (Joint Test Action Group) interface, and the like. Examples of such fixed-function blocks include, but are not limited to, timer blocks, counter blocks, and pulse-width modulation (PWM) blocks. Such fixed-function blocks may be implemented on-chip by using circuitry elements that include, but are not limited to, one or more counters (e.g., 8-bit, 16-bit, etc.), one or more capture registers, one or more period registers, one or more compare registers, one or more center-aligned PWM elements, one or more clock pre-scaling elements, one or more pseudo random PWM elements, and one or more quadrature decoding elements. At least some of the fixed-function blocks in array 136 have constrained (limited) connectivity to IO pins 150—for example, at least some fixed-function blocks can connect to some (e.g., one, two, and/or three), but not all, of IO pins 150.

HSIO matrix 140 provides constrained connectivity to IO pins 150. (In FIG. 1B, for illustration purposes IO pins 150 are shown as a block at the bottom of programmable device 101; in various embodiments, however, the IO pins may be located on two or more of the sides of the device.) In some embodiments, HSIO matrix 140 comprises a set of multiplexers and/or other components that are physically located closer to the IO pins 150 in order to improve timing. Because of their location on programmable device 101, however, the set of multiplexers provide constrained connectivity to IO pins 150. For example, the set of multiplexers can transmit signals between IO pins 150 and some fixed-function blocks (e.g., in GPIO blocks 130 and/or in special functions array 136), where these fixed-function blocks can be coupled to some (e.g., one, two, and/or three), but not all, of IO pins 150 over the set of multiplexers.

In this manner, the architecture of device 101 may impose physical restrictions on the connectivity between various components of the device. By design, the architecture of the device may be such that at least some fixed-function blocks (e.g., such as GPIO blocks 130 and special functions array 136) cannot be coupled to all of the IO pins 150 available on the device. For example, at least some of the GPIO blocks and special function blocks may not be (directly or indirectly) coupled to digital array 132 and/or to digital interconnect 142, and therefore their signals cannot be routed through the digital array and/or the digital interconnect to all IO pins of the device. As a result, such GPIO blocks and special function blocks can be coupled only to a very limited set (e.g., one to three) of the IO pins available on the device.

Figure 2:
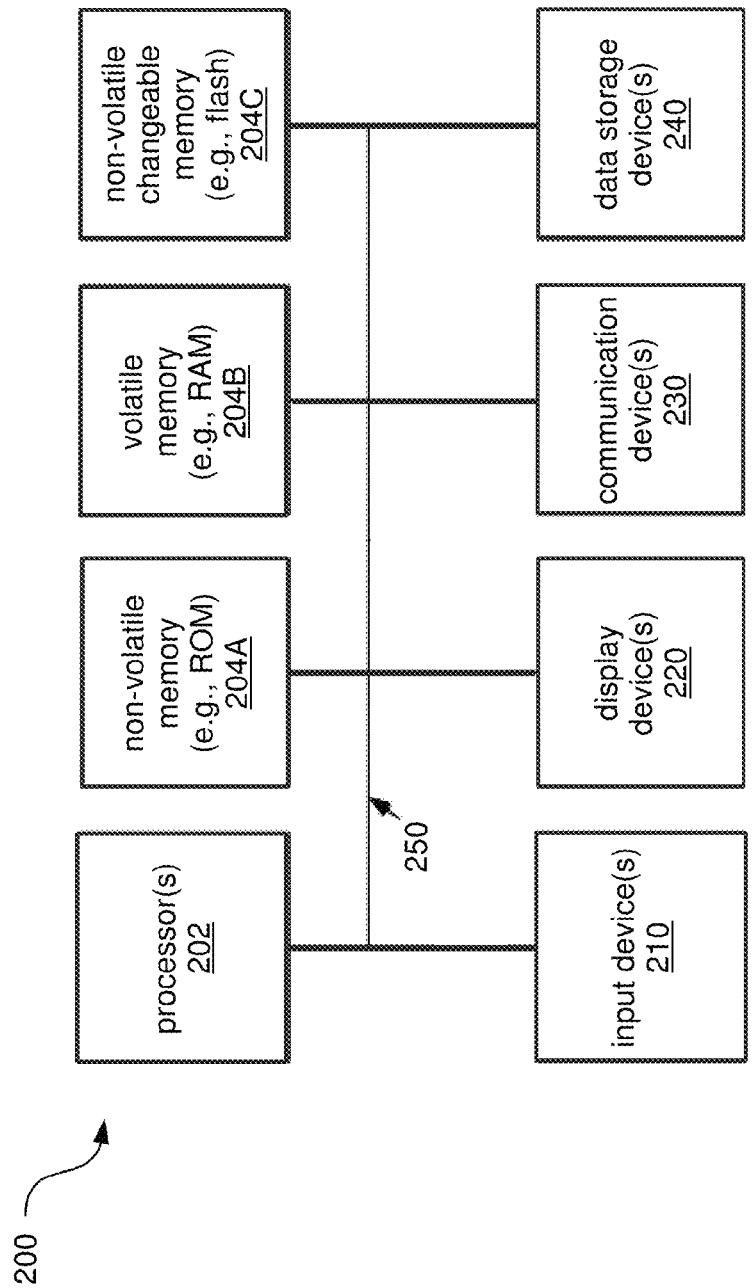
FIG. 2 is a block diagram illustrating an example computing device on which various embodiments may be implemented.

FIG. 2 illustrates basic hardware components that may be included in computer system 200, which may form a hardware platform for executing an IDE logic or other EDA programs, according to example embodiments of the placement techniques described herein. Computer system 200 includes one or more address/data buses 250 for communicating data, one or more processors 202 operatively and functionally coupled with bus 250 for processing data and executing instructions, non-volatile memory 204A (e.g., read-only memory, or ROM) coupled with bus 250 for storing static data and instructions for processor(s) 202, and volatile memory 204B (e.g., random access memory, or RAM) coupled with bus 250 for storing data and executable instructions for processor(s) 202. Computer system 200 may also include one or more system interfaces (not shown), and a changeable, non-volatile memory 204C (e.g., flash memory, EPROM, and the like) for storing data and/or firmware instructions for processor(s) 202 that can be replaced and/or updated after the manufacture of the computer system.

Computer system 200 may also include one or more input devices 210 and one or more display devices 220 that are coupled to processor(s) 202 over bus 250. Input device(s) 210 may include an alphanumeric input device (e.g., such as a touch-sensitive or typewriter-style keyboard), a pointing device that provides spatial input data (e.g., such as a computer mouse or equivalent device), and/or any other suitable human interface device that can communicate user commands and other user-generated information to processor(s) 202. Display device(s) 220 may include a liquid crystal display (LCD) device, cathode-ray tube (CRT) monitor, field emission device (FED, or "flat panel" CRT) device, light emitting diode (LED) display device, plasma display device, electro-luminescent display device, or any other display device suitable for creating graphic images and alphanumeric characters recognizable to the user.

Computer system 200 may also include one or more communication devices 230 and one or more data storage devices 240 that are coupled to processor(s) 202 over bus 250. Communication device(s) 230 are configured to transmit and receive data to and from other computer systems and/or computing devices. For example, communication device(s) 230 may include a USB controller and bus for communicating with USB peripheral devices, a network interface card (NIC) for communicating over wired communication networks, and/or wireless network card that can implement a variety of wireless data-transmission protocols, for example IEEE 802.11 and/or Bluetooth. Data storage device(s) 240 are configured for persistently storing data and information that is used by computer system 200 and/or by its user(s). Data storage devices 240 may include persistent storage media of one or more types including, but not limited to, electromagnetic disks (e.g., hard disks), optical storage disks (e.g., CD-ROMs), magneto-optical storage disks, solid-state drives, USB flash drives, and the like.

Figure 3:
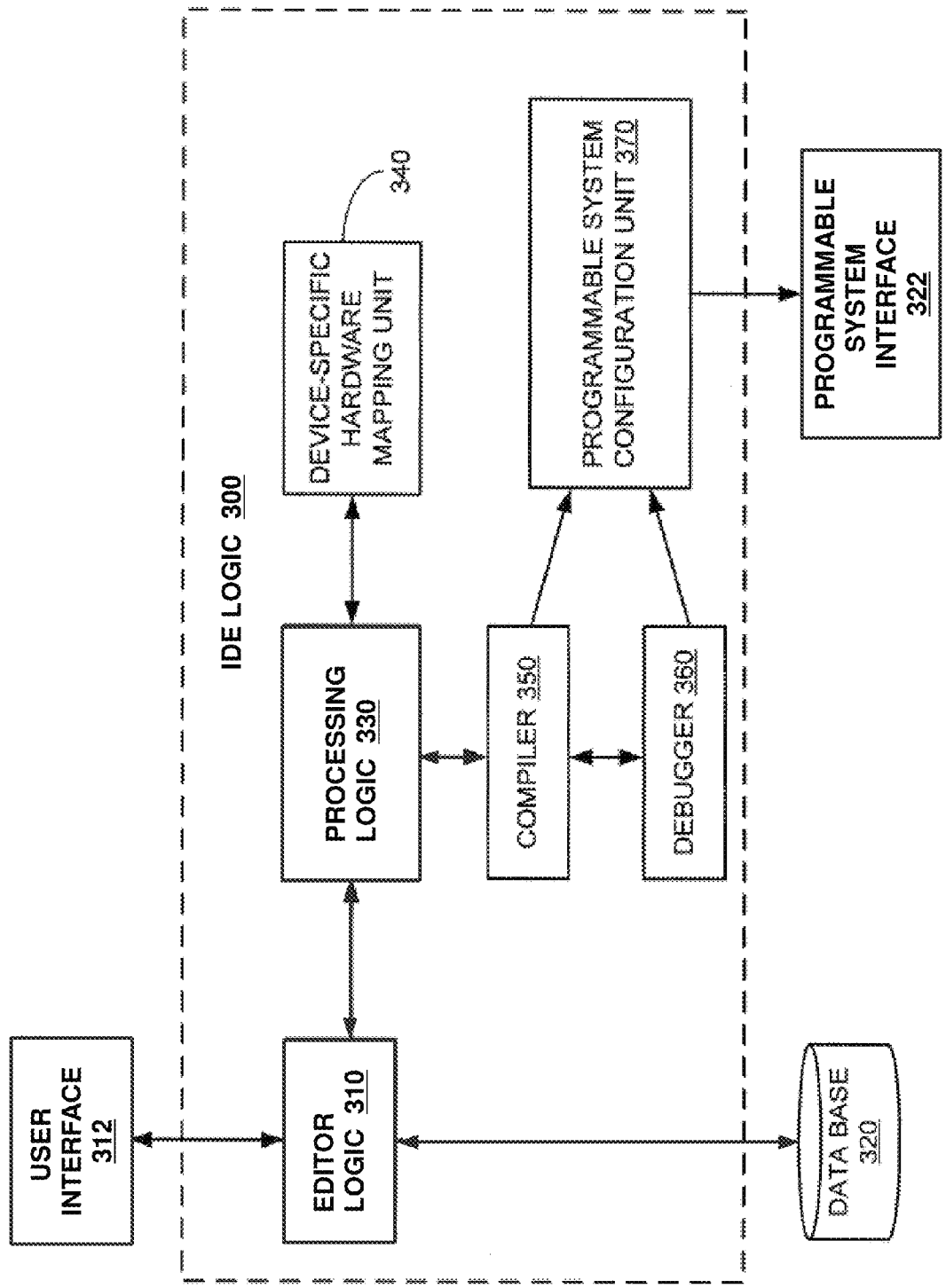
FIG. 3 is a block diagram illustrating an example integrated development environment that may be used to implement various embodiments.

FIG. 3 illustrates an example embodiment of an IDE logic (e.g., such as IDE logic 300 in FIG. 1A). Referring to FIG. 3, IDE logic 300 may be implemented as one or more modules that are stored in volatile or non-volatile memory and are executable by one or more computer systems. In some embodiments, an IDE logic may be at least partially implemented by a set of one or more discrete hardware components (not shown) in a computer system or another computing device.

In the embodiment illustrated in FIG. 3, IDE logic 300 includes editor logic 310 to receive and edit information describing hardware circuitry. The information describing hardware circuitry can be received from various sources and in various formats, for example, through one or more user interfaces 312 that may include a graphical user interface (GUI) and/or a command-line interface (CLI). Editor logic 310 can include (and/or invoke) various development tools that present a user/designer with options for inputting circuit designs or descriptions thereof to IDE logic 300. For example, editor logic 310 can receive code written according to a hardware description language, such as Verilog or VHDL. Editor logic 310 can also provide a graphics-based circuit design application, such as a Schematic Editor, a Symbol Editor, etc., which allow designers and other users to create schematic diagrams of the hardware circuitry to be implemented by a programmable target device (e.g., such as programmable target device 100 in FIG. 1A). In some embodiments, editor logic 310 can access database 320 to determine dependencies, build rules, and debug rules for the received descriptions of the hardware circuitry.

Editor logic 310 can also receive user-generated program code from user interface 312 or from other system interface. The program code can utilize at least one application programming interface generated by the IDE logic to communicate with the hardware components in a programmable target device (e.g., such as programmable target device 100 in FIG. 1A). This program code can also include at least one application programming interface to allow a processor or a microcontroller in the programmable target device, when programmed with the code, to communicate with hardware components in the target device.

IDE logic 300 also includes processing logic 330, which may be configured to perform various functionalities. For example, processing logic 330 may be configured to generate configuration files from the received descriptions of the hardware circuitry. In some embodiments, when the received descriptions of the hardware circuitry are in an abstracted or generic format, processing logic 330 can access a device-specific hardware mapping unit 340 to map the received descriptions of the hardware circuitry to the digital and/or analog components of a programmable target device. In other words, the processing logic can determine where and how the programmable target device implements the circuitry provided by the user/designer. This level of abstraction allows users without specific knowledge of the programmable target device to program and configure the target device to perform various applications through the use of generic circuit descriptions and diagrams. Processing logic 330 can also be configured to generate the configuration files from the device-specific version of the hardware circuitry descriptions.

Processing logic 330 may also generate one or more application programming interfaces (APIs) from the received descriptions of the hardware circuitry. For example, an application programming interface, when provided to a programmable target device, can program one or more processors or microcontrollers to allow them to communicate with hardware components of the target device.

Processing logic 330 may also include a placer logic (also referred to as "placer") that is configured to implement the techniques described herein for placement of digital portions of electronic designs on highly constrained chip architectures.

As illustrated in FIG. 3, IDE logic 300 also includes a compiler 350 to compile the configuration files and/or the application programming interfaces and link them into executables and/or firmware code that can be loaded onto a programmable target device (e.g., such as programmable target device 100 in FIG. 1A). Once the configuration files and the application programming interfaces have been compiled and linked, compiler 350 can provide them to programmable system configuration unit 370 to send them to the programmable target device, for example, via a programmable system interface 322. The programmable target device can configure its components (e.g., such as programmable arrays, fixed-function blocks, IO pins, switches, hubs, interconnects, etc.) according to the configuration files and can program its microcontroller according to the application programming interfaces in order to implement the hardware circuitry described by the user/designer.

Compiler 350 can also provide the configuration files and the application programming interfaces to debugger 360 (e.g., such as debug hardware 208 in FIG. 1A). Debugger 360 can perform debugging operations on the programmable target device that is configured with the configuration files and the application programming interfaces. For example, debugger 360 can perform step over, step into, and step out operations, which allows users the ability to perform incremental evaluations that step through programming code.

Various embodiments of the placement techniques described herein may be implemented as a computer program product that may include instructions stored on non-transitory computer-readable media, e.g., such as volatile storage and/or non-volatile storage. For example, a computer program product may include executable instructions that implement IDE logic 300, editor logic 310, and/or processing logic 330, as described above with respect to FIG. 3. These instructions may be used to program one or more computer systems or computing devices that include one or more general-purpose or special-purpose processors (e.g., CPUs) or equivalents thereof (e.g., such as processing cores, microcontrollers, and the like). When executed by the processor(s) or the equivalents thereof, the instructions cause the computer systems or computing devices to perform the operations that comprise the placement techniques described herein. A non-transitory computer-readable medium may also include one or more mechanisms for storing or transmitting information in a form (e.g., software, processing application, etc.) that is readable by a machine (e.g., such as a computing device or a computer system). Such non-transitory computer-readable storage medium may include, but is not limited to, electromagnetic storage medium (e.g., floppy disks, hard disks, and the like), optical storage medium (e.g., CD-ROMs and the like), magneto-optical storage medium, read-only memory (e.g., ROM and the like), random-access memory (e.g., RAM and the like), erasable programmable memory (e.g., EPROM, EEPROM, and the like), flash memory, or another now-known or later-developed type of medium that is suitable for storing information and/or executable instructions.

Additionally, some embodiments of the techniques described herein may be practiced in distributed computing environments where the computer-readable medium is stored on, and/or executed by, more than one computing device or computer system. One example of such distributed computing environment is a client-server environment where some of the various functionalities of the techniques described herein may be performed by a client computer system and/or some of the functionalities may be performed by a server computer system. Another example of such distributed computing environment is a cloud computing environment. In a cloud computing environment, computing resources are provided and delivered as a service over a network such as a local-area network (e.g., LAN) or a wide-area network (e.g., the Internet). Examples of cloud-based computing resources may include, but are not limited to: physical infrastructure resources (e.g., physical computing devices or computer systems, and virtual machines executing thereon) that are allocated on-demand to perform particular tasks and functionalities; platform infrastructure resources (e.g., an operating system or OS, programming language execution environments, database servers, web servers, and the like) that are installed/imaged on-demand onto the allocated physical infrastructure resources; and application software resources (e.g., application servers, single-tenant and multi-tenant software platforms, and the like) that are instantiated and executed on-demand in the environment provided by the platform infrastructure resources. In various distributed computing environments, the information transferred between the various computing devices and/or computer systems may be pulled or pushed across the transmission medium connecting the computing devices and/or computer systems.

Figure 4:
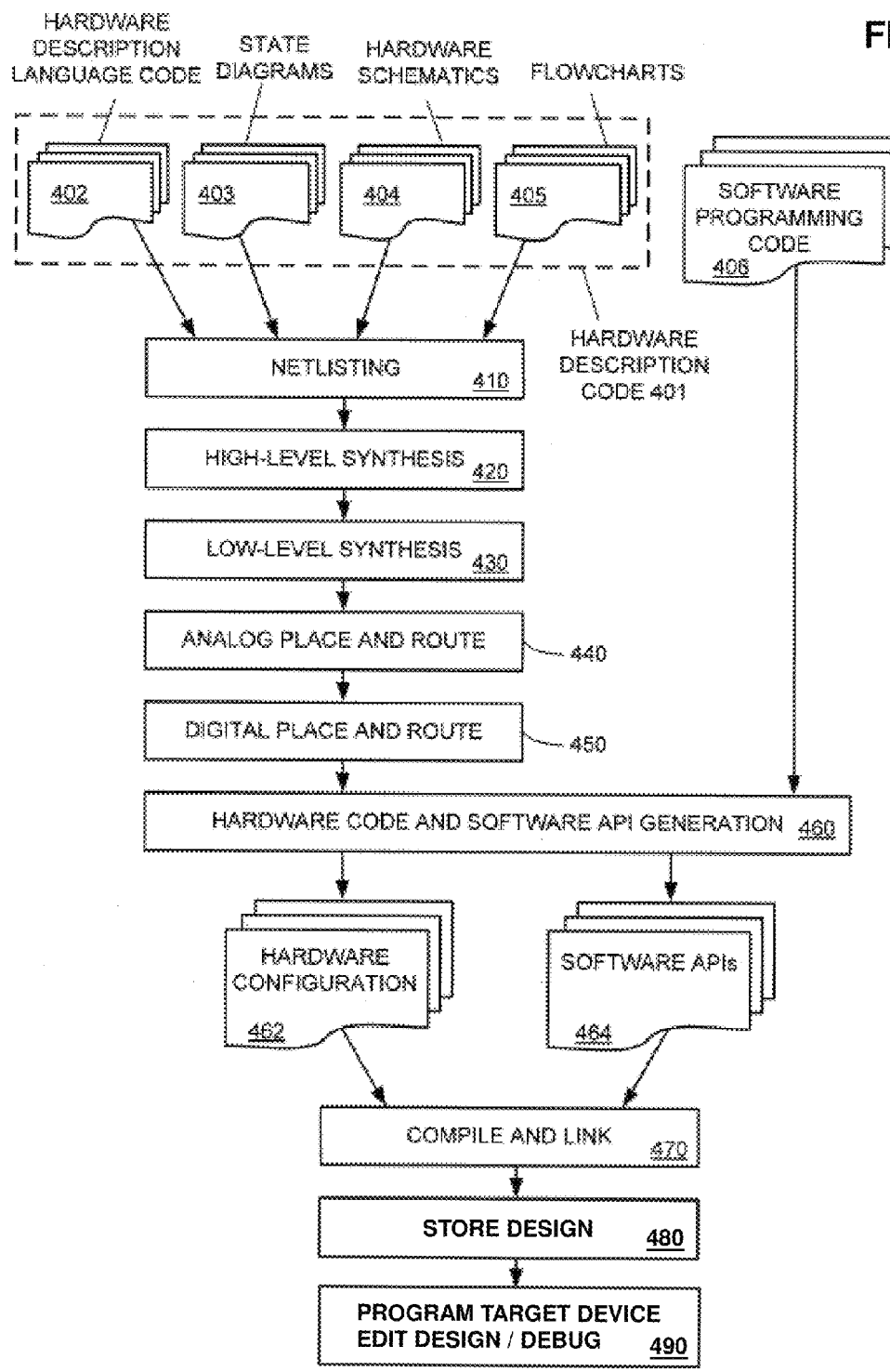
FIG. 4 illustrates a design automation flow according to an example embodiment.

FIG. 4 is a block diagram illustrating a design automation flow according to one embodiment. The various steps of the flow in FIG. 4 are described hereinafter as being performed by an editor logic, a processing logic, a compiler, a debugger, and a configuration logic, etc. (e.g., such as editor logic 310, processing logic 330, compiler 350, debugger 360, and programmable system configuration unit 370 of FIG. 3) that are executed by one or more computer systems. It is noted, however, that various implementations and embodiments may use different, and possibly multiple, components to perform the operations of the flow in FIG. 4. For example, in various embodiments such components may be implemented in a single integrated component or their functionality may be spread across two or more components that may perform some additional operations and functionalities. Thus, the description hereinafter of the flow in FIG. 4 is to be regarded in an illustrative rather than a restrictive sense.

Referring to FIG. 4, an editor logic receives hardware description code 401, such as hardware description language code 402, state diagrams 403, hardware schematics 404, and flowcharts 405, which describe the hardware circuitry of an electronic design. The hardware circuitry can include a set of circuitry elements that are connected in some specific way(s) to perform the various applications, functions, and operations intended by the electronic design. Hardware description language code 402 can be written in Verilog, VHDL, or other similar hardware description language. Hardware schematics 404 can be schematic diagrams of the hardware circuitry created with a graphics-based circuit design application, such as a Schematic Editor, a Symbol Editor, etc. After receiving the hardware description code 401 (and/or any user edits thereto), the editor logic passes the hardware description code to a processing logic.

In block 410, the processing logic performs netlisting of hardware description language code 402, state diagrams 403, hardware schematics 404, and/or flowcharts 405, to generate a single representation (e.g., such as one or more netlists) of the hardware circuitry to be implemented by a programmable target device (e.g., such as programmable target device 100 of FIG. 1A). For example, as part of netlisting, the processing logic can combine and integrate the circuitry descriptions, which may have various formats, into a single netlist that represents the entire hardware circuitry. In various embodiments, the information of a netlist may be stored in data structures that include, but are not limited to, files, tables, lists (e.g., structured lists, length-name-value pairs lists, and the like), data records (e.g., records stored in relational, hierarchical, or object-oriented databases), data objects instantiated from object-oriented classes, arrays, and/or any other suitable structured data arrangements that can store persistent or in-memory data.

In block 420, the processing logic performs high-level synthesis on the netlist that represents hardware description code 401. As part of the high-level synthesis, the processing logic breaks down (e.g., reduces) the netlisted hardware description code into lower level analog and digital primitives, logic equations, flip-flops, and/or other low-level components, and stores the reduced description code in (or in association with) the corresponding netlist.

In block 430, the processing logic maps the reduced hardware description code in the netlist to the programmable target device through low-level synthesis. As part of the low-level synthesis, the processing logic: (1) determines which hardware resources or components within the programmable target device can implement the circuitry components and primitives described by the reduced hardware description code in the netlist; and (2) stores in (or in association with) the netlist a mapping that associates instances representing the components and primitives with corresponding types of hardware resources of the programmable target device. In various embodiments, an instance may be implemented as a set of data, as one or more records in a database, as one or more entries on a list, as a name-value pair, as an object-oriented class instance, as a set of ordered values, and as any other suitable data object that can store or represent data; in operation, a data object may be stored on volatile and/or non-volatile media.

In block 440, the processing logic performs placement and routing of the analog component instances specified in the netlist that represents the hardware circuitry of the electronic design. For example, the processing logic determines the locations (e.g., programmable analog array(s), analog function blocks, etc.) where the analog component instances are to be placed in the target device. As part of the analog placement and routing, the processing logic may also allocate or set the analog signal routing for the hardware circuitry of the electronic design, for example, by specifying and storing the states (e.g., open or closed) of any switches and other components that are part of the analog interconnect(s) of the target device.

In block 450, the processing logic performs placement and routing for the digital component instances specified in the netlist that represents the hardware circuitry of the electronic design. For example, the processing logic determines the locations (e.g., programmable digital array(s), fixed-function blocks, IO pins, etc.) where the digital component instances are to be placed in the target device. As part of the digital placement and routing, the processing logic may also allocate or set the digital signal routing for the hardware circuitry of the electronic design, for example, by specifying and storing the states (e.g., open or closed) of any switches that are part of the digital interconnect(s) of the target device.

As part of the digital placement and routing, in block 450 the processing logic also performs the techniques that are described herein for placement of electronic designs in highly constrained chip architectures. For example, the processing logic uses a backtracking search according to the techniques described herein to place simultaneously the FFB instances and the IO instances that are specified in the netlist that represents the hardware circuitry of the electronic design.

In block 460, the processing logic generates hardware configuration files 462 and application programming interfaces 464. For example, the processing logic generates hardware configuration files 462 based on the netlist of the reduced hardware description code and based on the placement and routing performed in blocks 440 and 450. The processing logic generates application programming interfaces 464 based on software programming code 406 received from at least one system interface, and possibly based on the netlist of the reduced hardware description code and on the placement and routing performed in blocks 440 and 450. Software programming code 406 may include at least one application programming interface to allow a processor or a microcontroller in the programmable target device, when programmed with the software programming code, to communicate with hardware components in the target device.

In block 470, a compiler compiles and links application programming interfaces 464 and any user-provided code into executable code (e.g., such as firmware), and also compiles and/or otherwise prepares hardware configuration files 462 for loading to the programmable target device (e.g., in the form of firmware configuration). After block 470 is completed, the electronic design specified in hardware description code 401 is considered to be "placed and routed" for the programmable target device—for example, a representation (e.g., such as the combination of the hardware configuration and software APIs) of the placed and routed design has been generated and can be programmed into a target device to implement the functionalities and operations defined in the design.

In block 480, the compiler (or other logic such as the processing logic) stores the placed and routed electronic design into persistent storage. In various embodiments, a placed and routed electronic design may be stored in any suitable storage media and in any suitable data structures or formats. Examples of suitable storage media include, but are not limited to, various volatile and/or non-volatile computer-readable storage media as described heretofore. Examples of suitable data structures and formats include, but are not limited to, one or more files (e.g., such as design project files), one or more data records (e.g., records stored in relational, hierarchical, or object-oriented databases), one or more sets of data objects instantiated from object-oriented classes, and/or any other suitable structured data arrangements that can store persistent or in-memory data.

In block 490, a configuration logic may send the compiled and linked hardware configuration files 462 and application programming interfaces 464 to the programmable target device. In this manner, the programmable target device (e.g., such as programmable target device 100 in FIG. 1A) is configured to implement the hardware circuitry of the electronic design (e.g., as defined in hardware description code 401) responsive to the hardware configuration files and the application programming interfaces. Alternatively, or in addition to, in block 490 the editor logic may access and/or open a placed and routed electronic design for further editing as initiated by a user/designer. Alternatively, or in addition to, in block 490 a debugger may execute a debugging application to debug the programmable target device when any issues are found or when a design (or a re-design) needs to be tested.

In some embodiments, the processing logic can receive an indication to initiate automatic configuration and programming of the programmable target device after receiving the input information 401 and 406. The processing logic, the compiler, and/or the configuration logic can automatically perform some or all operations associated with the blocks 410-490 in response to receiving the indication. In some embodiments, the indication can be received from a user/designer via at least one of the system interfaces.

Digital Placement for Connectivity-Constrained Architectures

In some embodiments, the architecture of a device (e.g., a programmable chip) may impose physical restrictions on connectivity between various components of the device. By its design, the architecture of the device may be such that at least some fixed-function blocks cannot be coupled to all of the IO pins available on the device over any fixed or programmable routes. For example, the signals to/from at least some of the fixed-function blocks may not be routed to all IO pins of the device because the device does not provide the routing means (e.g., traces, switches, hubs, interconnects, etc.) to do so. As a result, each of these fixed-function blocks can be respectively coupled only to a very limited set (e.g., one to three) of the IO pins available on the device.

Examples of such connectivity-constrained fixed-function blocks include, but are not limited to, timers, counters, PWMs, and SCBs. Per the design architecture of a programmable chip, such fixed-function blocks may be purposefully constructed on certain locations of the chip (e.g., such as GPIO and other peripherals) that do not or cannot have full routing to all IO pins available on the chip. Thus, a connectivity-constrained fixed-function block can be physically coupled (directly, or indirectly through other components) only to a very specific IO pin or to at most two or three IO pins (but certainly a lot less than the number of pins to which a fully routed architecture would provide access). For example, an input of a PWM block in a given location of a chip (e.g., "PWM_02") can be coupled directly or indirectly only to a given IO pin (e.g., "Pin_6[1]"); thus, placing a PWM instance on the PWM block in location "PWM_02" and placing the input IO instance for the PWM instance on any pin other than "Pin_6[1]" would result in an invalid placement. A placement is considered invalid if it violates a placement rule or the placer can determine that it does not have a routing solution.

In general, the placement for components of an electronic design is represented as a one-to-one mapping of component instances to locations on a target device. A location on the target device (e.g., such as an IO pin or a fixed-function block) is indicated by a unique identifier that uniquely identifies the type of component and the physical location on the device where the component is built. For example, in some embodiments an IO pin may be identified by a unique combination of a port number and a PIN number. In some embodiments, a fixed-function block may be identified by a unique combination of its type (e.g., timer, counter, PWM, SCB, etc.) and an index, which uniquely distinguishes between the different blocks with the same type that are physically provided on the device. In some embodiments, all such location identifiers may be stored in a device-specific database that describes and identifies the physical components and other characteristics of a given chip device. It is noted that while various embodiments may use various placement mapping and location identification schemes, the techniques described herein for placement in connectivity-constrained architectures are not limited to any particular mechanisms for representing placement mappings or for identifying device locations.

In some embodiments, the techniques described herein are implemented for placing digital fixed-function blocks on devices with connectivity-constrained architectures. It is noted, however, that technically some digital fixed-function blocks may also include some analog circuitry elements (e.g., ADCs, operational amplifiers, etc.) since such analog elements may be needed to perform the specific digital functions of the digital blocks. Thus, the placement techniques described herein would be applicable for a fixed-function block that performs a digital function even if such block includes some analog circuitry elements. Further, for the purposes of the techniques described herein, a fixed-function block that is coupled to a digital block array would not be considered as being connectivity-constrained because a digital block array would generally be fully routed to allow any block therein to be coupled to any IO pin. For the same reason, a digital block in a programmable digital block array (e.g., such as a FPGA, PLD, or CPLD) that is dedicated to perform a specific function (e.g., a timer) would not be considered as being connectivity-constrained for the purpose of the placement techniques described herein.

When component instances of an electronic design need to be placed on connectivity-constrained components of a target device, there would be many interdependencies and contingencies between the component instances and thus the placement of interdependent instances with different types cannot be performed independently of each other in separate phases. To address such interdependencies and contingencies between FFB instances and IO instances, the placement techniques described herein provide for simultaneous placement of FFB instances and IO instances. In this context, as used herein "simultaneous" and "simultaneously" refer to placing FFB instances and IO instances by using a single framework to handle the placement for both the FFB instances and the IO instances. For example, in some embodiments a placer logic may pool the FFB instances and the IO instances of an electronic design into a group of instances, may sort the group using one or more heuristics, and may then place the sorted instances in the group by using the same backtracking search logic.

Example Placement Methods

Figure 5:
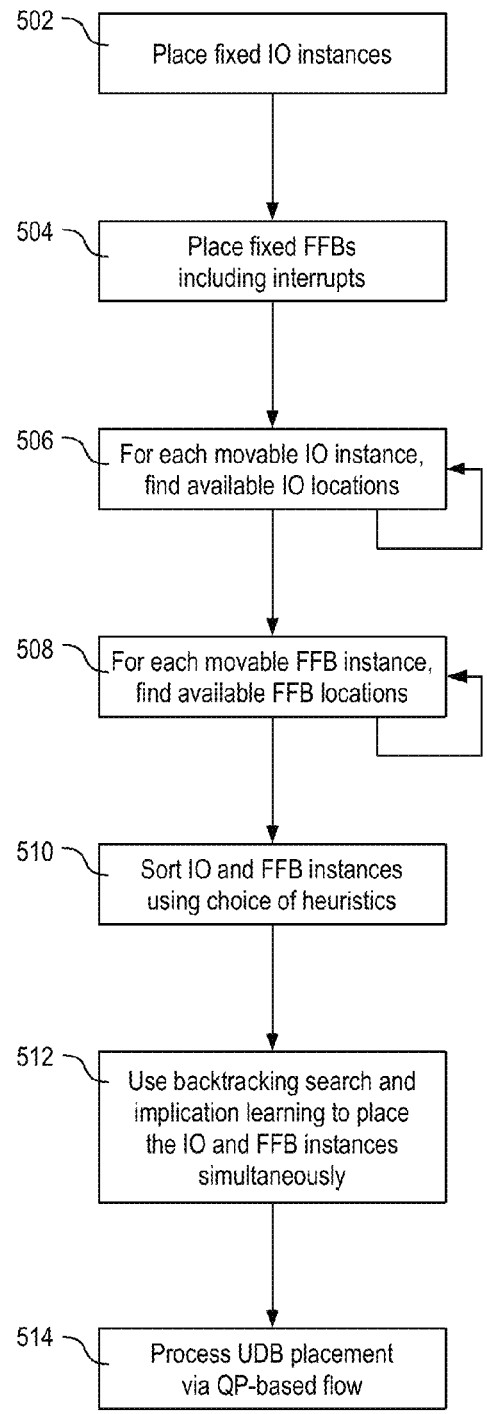
FIG. 5 is a flow diagram illustrating an example method for placement of electronic designs according to one embodiment.

FIG. 5 is a flow diagram illustrating an example method for placement of component instances in electronic designs according to the techniques described herein. The operations of the method in FIG. 5 may be performed as part of an automation design flow in an EDA program (e.g., as part of the operations in block 450 of FIG. 4.) It is noted that the operations in the blocks of FIG. 5 are described hereinafter as being performed by placer logic (also referred to as just "placer") that is executed by one or more computer systems. It is noted, however, that various implementations and embodiments may use different, and possibly multiple, components to perform the method of FIG. 5. For example, in various embodiments such components may be implemented in a single integrated component or their functionality may be spread across two or more components that may perform some additional operations and functionalities. Thus, the description hereinafter of the method in FIG. 5 is to be regarded in an illustrative rather than a restrictive sense.

In block 502, a placer logic places the fixed IO instances that are included in the netlist(s) that represent the digital portion of an electronic design. An IO instance is considered fixed (non-movable) if it must be placed on a specific IO pin of the target device, where such IO pin may be identified or set by a user/designer or by some automated design logic. For example, in some embodiments the hardware language description code, state diagrams, hardware schematics, and/or flow charts of the electronic design may have been processed, and at least one netlist for the electronic design may have been created and stored prior to the operations in block 502. Then, as part of the operations in block 502, the placer logic may process the netlist to determine the IO instances that are fixed and their locations on the target device, and may then store these IO instances in association with their respective IO pin locations in the placement mapping.

In block 504, the placer logic places the fixed FFB instances (including fixed-function interrupts) that are included in the netlist(s) of the digital portion of the electronic design. An FFB instance is considered fixed (non-movable) if it must be placed on a specifically-identified fixed-function block of the target device, where such fixed-function block may be specifically identified or set by a user/designer or by some automated design logic. The fixed-function interrupts may include standard interrupts from on-chip peripherals that perform fixed functions (e.g., such as PWMs, SCBs, etc). For example, as part of the operations in block 504, in some embodiments the placer logic may process the netlist to determine the FFB instances that are fixed, their locations on the target device, and their fixed-function interrupts (if any). Then, the placer logic may store these FFB instances in association with their respective fixed-function block locations in the placement mapping, and may allocate or set any signal routing (e.g., such as switches, multiplexers, interconnects, etc.) that is necessary to facilitate implementation of the fixed-function interrupts.

It is noted that there may be several reasons why an instance (such as an IO instance or FFB instance) may be identified in a netlist as fixed/non-movable. One such reason is that a user/designer may specify that an instance must be placed at a particular location on the target device, and such user requests must be honored by the placer logic. Another reason is that a user/designer may specify that a certain instance (e.g., IO instance) must be placed on a particular location, and such placement in turn may force some other instance (e.g., FFB instance) to be placed at a certain location on the target device, thereby making this other instance fixed. Another reason is that for mixed-signal designs, an analog placer typically runs before the digital placer and assigns fixed locations (pins) for analog IO instances; thus, since the digital placer is not allowed to move any IO instances assigned by the analog placer, this condition may also result in fixed/non-movable instances. Another reason is that for some specific target devices and electronic designs, there may be only one location on the entire device where a certain instance can be implemented, which automatically makes this instance fixed. Because of these and similar reasons, the techniques described herein provide for placing fixed IO and FFB instances before any other movable IO and FFB instances are placed.

In block 506, the placer logic finds the locations (e.g., IO pins) in the target device that are available for placing each remaining movable IO instance, and stores the identifiers of these locations in a suitable volatile and/or non-volatile storage. An IO instance is considered movable if it can be placed and implemented on more than one, but not all, of the IO pins of the target device. For example, because of the connectivity-constrained architecture of the target device, in some embodiments a given IO instance may be placed only on two or three of the IO pins of the target device. This makes the given IO instance movable since there are more than one location choices (IO pins) where it can be placed on the target device; however, the number of these location choices is still limited because of the constrained architecture of the device.

In block 508, the placer logic finds the locations (e.g., fixed-function blocks) in the target device that are available for placing each remaining movable FFB instance, and stores the identifiers of these locations in a suitable volatile and/or non-volatile storage. An FFB instance is considered movable if it can be placed and implemented on more than one, but not all, of the fixed-function blocks of the target device. For example, because of the connectivity-constrained architecture of the target device, in some embodiments a given FFB instance may be placed only on two or three of the fixed-function blocks of the target device. This makes the given FFB instance movable since there are more than one location choices (fixed-function blocks) where it can be placed on the target device; however, the number of these location choices is still limited because of the constrained architecture of the device.

In block 510, the placer logic sorts the remaining (not-yet-placed) IO instances and FFB instances using a choice of heuristics. For example, in some embodiments the placer logic may pool the movable IO instances and the movable FFB instances in a group, and may then sort the group by using one or more ordering heuristics. One such heuristic may specify that a first FFB instance is to be processed for placement before a second FFB instance when the first FFB instance can be placed on fewer fixed-function blocks than the second FFB instance. A second heuristic may specify that, when processing a movable FFB instance, any IO instances associated with (e.g., implied by) the movable FFB instance are to be processed for placement before any subsequent FFB instance is processed. A third heuristic may specify that members of a subset, which includes one or more FFB instances and any implied IO instances corresponding thereto, are to be treated as single entities with multiple location choices when any member of the subset has more than one location choice for placement. It is noted that conventional placers for target devices with fully-routed architectures typically do not perform a sorting operation on both IO and FFB instances with a common heuristic because, in contrast with the placement techniques described herein, such conventional placers typically place IO instances separately from and independently of FFB instances in different placement phases.

In block 512, the placer logic uses a backtracking search and implication look-ahead with conflict learning to place the sorted IO instances and FFB instances simultaneously—i.e., by using a single framework to handle the placement for the sorted IO and FFB instances in the same placement phase. For example, in some embodiments the placer logic places one (IO or FFB) instance at a time by choosing the first available location for this current instance. Because of the connectivity-constrained architecture of the target device, the placer logic may find that it cannot place the current instance since the previously placed instances have not left a valid location for the current instance. In this case, the placer logic backtracks by undoing the placement of one or more previously placed instances and then tries different placement locations for these instances.

In some embodiments, as part of the backtracking search the placer logic may perform implication look-ahead searches. For example, in addition to placing the current (IO or FFB) instance, the placer logic performs a look-ahead search to try and find a location for an implied instance of the current instance. As used herein, "implied" instance is an instance whose placement location on a target device depends on the location of another instance. For example, a particular SCB instance may have some terminal IO instances connected to it; thus, in this case the terminal IO instances are considered to be implied by the SCB instance since they must be placed on some specific locations (IO pins) on the target device as dictated by the device's constrained architecture.

In some embodiments, the placer logic searches for valid locations for the implied instances of the current instance as part of the implication look-ahead search. If it does not find valid locations for the implied instances, the placer logic backtracks. If it finds valid locations, the placer logic speculatively "places" the implied instances thereon—for example, the placer logic may mark these valid locations as occupied without actually recording the implied instances as "placed" in the placement mapping. Thereafter, when it is the turn of an implied instance to be placed (e.g., according to the sort order of the grouped IO and FFB instances), the placer logic officially places the implied instance in the previously marked location. In some embodiments, the information indicating which IO pins depend on which fixed-function blocks may already be known and stored in a database (e.g., as part of a chip part-number specification). With this dependency information at hand, once a FFB instance is validly placed, the placer logic may simply check the database to determine whether any implied IO instances can be validly placed. If an implied instance has already been placed, then the placer logic simply checks to make sure that the placement is still valid. If the implied instance has not yet been placed, then the placer logic assigns to it a speculative location based on the dependency information and proceeds to place the next instance.

In block 514, the placer logic proceeds to place any other digital component instances that are specified in the netlist for the electronic design. For example, the placer logic may use a different placement algorithm (e.g., such as a QP-based flow that uses quadratic wire-length minimization) and/or different logic to place component instances on the digital blocks of a programmable digital array (e.g., such as UDB array) in the target device. It is noted that the operations in block 514 are performed as a different placement phase than the placement phase in which the interdependent IO and FFB instances were placed by the operations in blocks 502-512. This is because the digital blocks in a programmable digital array (such as a FPGA, PLD, or CPLD) are fully routed and can generally connect to any IO pin of the target device over suitable programmable interconnects; hence, the placement problem solved by the operations in block 514 is different than the placement problem solved by the operations in blocks 502-512 for connectivity-constrained device architectures.

Figure 6:
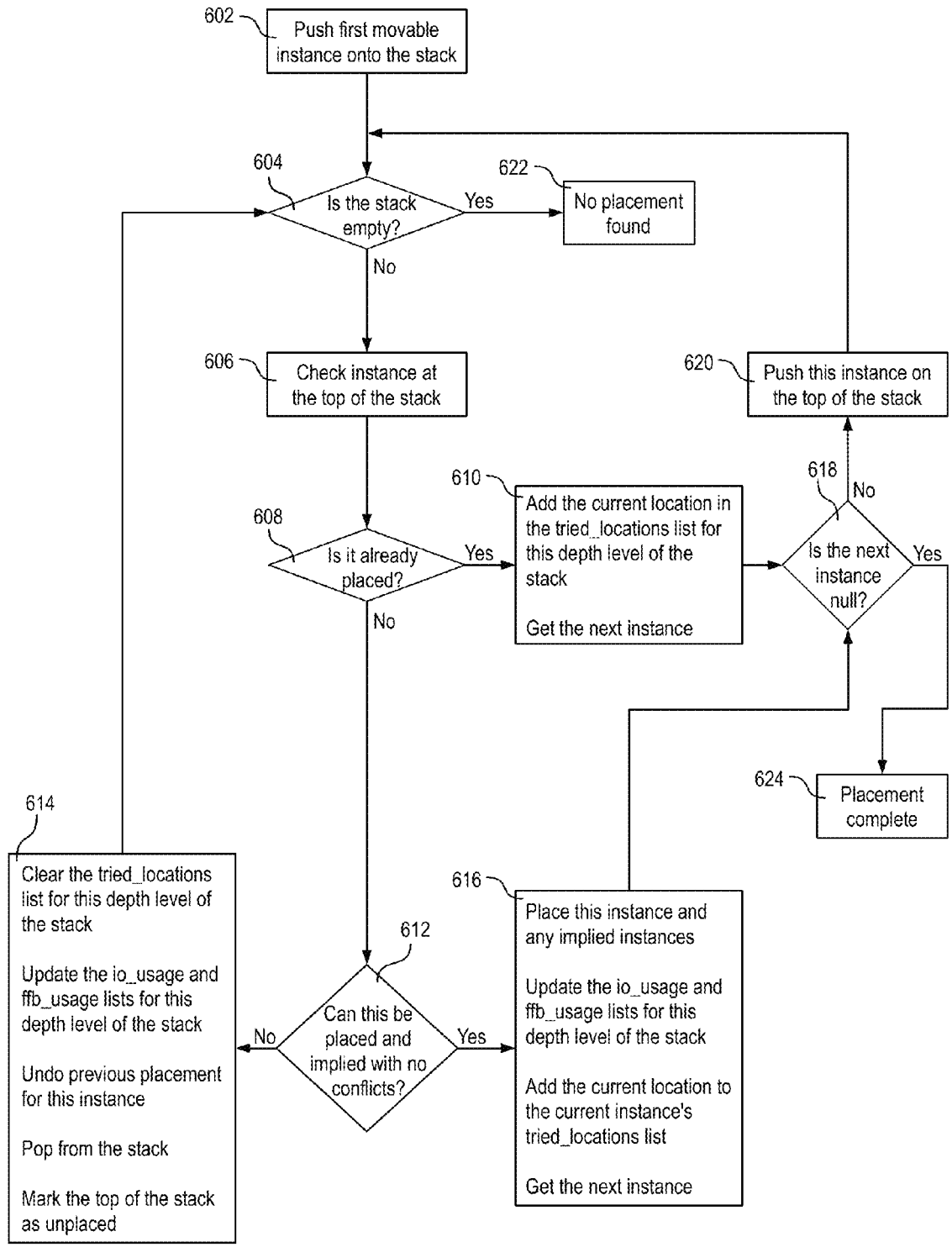
FIG. 6 is a flow diagram illustrating an example method for placing fixed-function block instances and input-output instances by using a stack according to one embodiment.

FIG. 6 is a flow diagram illustrating an example placement method that uses a stack to implement a backtracking search. The operations in the blocks of FIG. 6 are described hereinafter as being performed by placer logic that is executed by one or more computer systems. It is noted, however, that various implementations and embodiments may use different, and possibly multiple, components to perform the method of FIG. 6. For example, in various embodiments such components may be implemented in a single integrated component or their functionality may be spread across two or more components that may perform some additional operations and functionalities. Thus, the description hereinafter of the method in FIG. 6 is to be regarded in an illustrative rather than a restrictive sense.

The operations of the method in FIG. 6 may be performed as part of an automation design flow in an EDA program (e.g., as part of the operations in block 512 of FIG. 5.) In some embodiments, prior to the operations in the method of FIG. 6, the hardware language description code, state diagrams, hardware schematics, and/or flow charts of an electronic design have been processed, at least one netlist for the electronic design has been created and stored, and the movable IO instances and the movable FFB instances in the netlist have been identified and ordered into a unified sorted list.

In block 602, a placer logic pushes a movable (IO or FFB) instance on a stack. For example, the placer logic may access the next instance in the sorted list of movable IO and FFB instances and may push it on the top of the stack. As used herein, "stack" refers to one or more data structures that are operated in a First-In-Last-Out (FILO) mode. In various embodiments, a stack may be implemented by using various programming mechanisms and various types of data structures. By way of illustration, in some embodiments a stack may be implemented as a collection of lists and an indexing scheme thereon. For example, various stack operations (e.g., push, pop, etc.) may be implemented by traversing and manipulating indexes to keep track of the order of the instances in the collection of lists with respect to the stack and to maintain other stack-related information. In another example, in some embodiments a stack may be implemented in a FILO memory data structure and the stack operations may be performed by manipulating address pointers to this structure.

According to the placement techniques described herein, the placer logic uses a stack to keep track of information that is used to perform backtracking during the placement of interdependent IO and FFB instances. For example, the placer logic can perform backtracking by going down the stack and removing (popping) instances that have led to invalid placements. In some embodiments, the stack has as many depth levels as there are movable (IO and FFB) instances that need to be placed.

In block 604, the placer logic checks to determine whether the stack is empty. If the stack is not empty, the placer logic proceeds to block 606 and accesses (or retrieves) the information of the current (IO or FFB) instance that is on top of the stack.

In block 608, the placer logic determines whether the current (IO or FFB) instance has already been placed. If the current instance has already been processed and placed (e.g., as indicated by a corresponding record in the placement mapping for the electronic design), the placer logic proceeds to block 610. If the current instance is an implied instance of some other previously-placed instance, the placer logic has already determined and marked a location on the target device for this current (and implied) instance. Thus, in this case in block 608 the placer logic simply checks whether the marked placement location is still valid, and if so creates the corresponding record in the placement mapping for the design. The placer logic then proceeds to block 610.

In block 610, the placer logic adds the location of the current (IO or FFB) instance to a "tried_locations" list for the current depth level of the stack, and proceeds to get the next movable instance from the sorted list of movable IO and FFB instances. A "tried_locations" list is a suitable data structure (e.g., such as a list, array, etc.) that stores information indicating the locations that have been tried for a particular (IO or FFB) instance, where each depth level in the stack is associated with its own corresponding "tried_locations" list. By keeping track of this information, the placer logic avoids attempting to place the current instance in locations that have already been tried for this depth level of the stack. After block 610, the placer logic proceeds with the operations in block 618.

If in block 608 the placer logic determines that the current (IO or FFB) instance has not yet been placed, the placer logic proceeds to block 612. In block 612, the placer logic determines whether the current instance can be placed and implied with no placement conflicts. For example, the placer logic tries to find a valid location for the current instance. In addition, the placer logic uses an implication look-ahead search to try finding valid location(s) for any implied instance(s) of the current instance. If in block 612 the placer logic determines that the current instance cannot be placed and implied with no conflicts, it means that it is necessary to backtrack from the current instance and the placer logic proceeds to block 614.

In block 614, the placer logic performs the operations involved in backtracking from the current depth level of the stack for the current instance. For example, the placer logic clears the "tried_locations" list for the current instance at the current depth level of the stack. The placer logic also updates the "io_usage" list and the "ffb_usage" list for the current depth level of the stack. An "io_usage" list is a data structure that stores information indicating which IO pins (e.g., pin locations) of the target device have already been assigned for a given depth level of the stack, where each depth level in the stack is associated with its own corresponding "io_usage" list. In some embodiments, an "io_usage" list may be implemented as a per-stack-level list or array that stores flags for each IO pin of the target device. A "ffb_usage" list is a data structure that stores information indicating which fixed-function blocks (e.g., ffb locations) of the target device have already been assigned for a given depth level of the stack, where each depth level in the stack is associated with its own corresponding "ffb_usage" list. In some embodiments, a "ffb_usage" list may be implemented as a per-stack-level list or array that stores flags for each IO pin of the target device.

As part of the backtracking operations in block 614, the placer logic undoes any previous placement of the current instance. For example, the placer logic may undo any updates it has made in the placement mapping that are associated with the placement of the current instance. The placer logic then pops (removes) the current instance from the stack and, if the stack is not empty after the pop operation, marks as unplaced the (IO or FFB) instance that now remains on the top of the stack. The placer logic then proceeds back to block 604.

In block 604, the placer logic checks to determine whether the stack is currently empty. If the stack is empty, the placer logic determines that it has failed to find a placement for all of the movable IO and FFB instances in the electronic design. Thus, the placer logic proceeds to block 622 and records information indicating that no valid placement was found for all of the IO and FB instances.

If in block 612 the placer logic determines that the current (IO or FFB) instance and its implied instance(s) can be placed without conflicts, the placer logic selects a valid location for the current instance and valid location(s) for its implied instance(s) and then proceeds to block 616 to perform the operations involved in the placement thereof.

In block 616, the placer logic places the current (IO or FFB) instance and its implied instances. For example, the placer logic places the current instance on the location selected in block 612 and creates a corresponding record in the placement mapping for the electronic design. The placer logic also marks the location(s) it selected for the implied instance(s) as occupied without actually recording the implied instances as "placed" in the placement mapping. (It is noted that the implied instances will be officially placed when the placer logic processes them as their turn comes up in the sorted list of movable IO and FFB instances—e.g., per the operations in blocks 608 and 610.)

As part of the placement operations in block 616, the placer logic also updates the "io_usage" list and the "ffb_usage" list for the current instance at the current depth level of the stack. For example, if in block 616 the placer logic has placed an IO instance, the placer logic updates the "io_usage" list accordingly. Similarly, if in block 616 the placer logic has placed a FFB instance, the placer logic updates the "ffb_usage" list accordingly. The placer logic also adds the location, on which the current (IO or FFB) instance has been placed, to the "tried_locations" list for the current instance at the current depth level of the stack. The placer logic then gets the next movable instance from the sorted list of movable IO and FFB instances (e.g., if it's not empty), and proceeds with the operations in block 618.

In block 618, the placer logic determines whether the next (IO or FFB) instance is null, where a null instance indicates that there are no remaining unplaced instances. For example, if in blocks 610 or 616 the placer logic obtained a non-null (e.g., a valid) next instance from the sorted list of movable IO and FFB instances, the placer logic determines that there remain (IO or FFB) instances that still need to be placed. Thus, the placer logic proceeds with the operations in block 620. In block 620, the placer logic pushes the next (non-null, IO or FFB) instance on the stack, and then proceeds with the operations in block 604 as described heretofore.

If in blocks 610 or 616 the placer logic obtained a null (e.g., an empty, or invalid) next instance from the sorted list of movable IO and FFB instances, then in block 618 the placer logic determines that all instances on the sorted list of movable IO and FFB instances have been processed and successfully placed. Thus, the placer logic proceeds to block 624 and records information indicating that the placement of the movable IO and FFB instances of the electronic design is complete. The placer logic may then continue with other operations (e.g., such as the operations in block 514 of FIG. 5).

Implication Look-Ahead Searches and Conflict Learning

In some embodiments, the placement techniques described herein provide efficient implication look-ahead searches to reduce the complexity of the overall placement search. In some embodiments, the techniques described herein also provide conflict learning in the context of IO and FFB placement for early backtracking.

In various embodiments, the placement techniques described herein account for one or more types of implications between IO instances and FFB instances. Examples of such implication types include self implication, FFB to IO implications, IO to FFB implications, and IO to IO implications. These types of implications between IO instances and FFB instances are described hereinafter.

Self-Implication.

Once an (IO or FFB) instance is assigned to one of its available locations on a target device, the corresponding resource usage information (IO pin or fixed-function block) for the instance at current depth level (or state) of the stack is updated.

FFB to IO Implications.

When an FFB instance is assigned to a location (e.g., such as an identified fixed-function block on the target device), such assignment may imply that one of the IO instances connected to the FFB instance's terminals needs to be placed on one of a few selected locations (e.g., such as a specific IO pin on the target device). Thus, the placer uses a look-ahead search while placing the FFB instance to check whether there are any feasible locations (IO pins) available for IO instances connected to the current FFB instance. The placement of the FFB instance is allowed only when the placements of the associated IO instances is feasible (e.g., valid). If so, these implied IO instances are immediately implied and assigned to the locations (IO pins) that were found by the look-ahead search.

IO to FBB Implications.

If an IO instance is assigned a fixed IO location (e.g., such as a specific IO pin on a target device), then this IO location is excluded during the search process performed for movable IO and FFB instances. Such exclusion may imply that a terminal of some FFB instance that requires this fixed IO location may not be placeable. Thus, while placing a FFB instance, the placer checks all the associated IO instances that require specific locations. If such associated IO instance does not exist in the movable instance list, then the placer checks the assigned IO locations to see if they have the same IO instance allocated thereto. If not, then the placer determines that the attempted placement of the FFB instance is not feasible.

IO to IO Implications.

As used herein, "contiguous IO instances" and "contiguous set of IO instances" refer to a set of IO instances that need to be placed on adjacent IO pins (locations) in the correct, continuous order. Contiguous IO instances are typically requested or defined by a user/designer—for example, because an ordered set of traces needs to be connected to the IO pins of the target device (e.g., chip) when it is mounted on a printed circuit board (PCB). For contiguous IO instances, while assigning a particular IO instance to a particular IO pin (location) of the target device, the placer logic performs a feasibility check to determine whether the other IO instances of the contiguous set can be allocated to IO pins that are contiguous with the particular IO pin. For example, the placer can perform the feasibility check by iteratively checking whether the IO instances in the contiguous set can be assigned to contiguous locations. If the feasibility check fails, then the placer determines that the allocation of the particular IO instance to the particular IO pin is not valid (e.g., is not feasible). If the feasibility check succeeds, then the placer immediately assigns the IO instances in the contiguous set to the contiguous locations that were found by the feasibility check.

In various embodiments, the placement techniques described herein account for the various types of implications between IO instances and FFB instances. For example, in some embodiments the techniques described herein provide for implication look-ahead and conflict learning in order to facilitate early backtracking, which results in more efficient use of computing resources during runtime.

In some embodiments, the runtime operation of a placer (placer logic) can be improved by using information about the various implications (implied instances) in order to explore the search space efficiently. For example, before placing any instance the placer can process all the implications (but not necessarily in an ordered manner). Only when the implications are valid, the placer would mark the current instance as "placement exists" and would proceed with the search. Further, when an instance is assigned to a location, the placer handles all the implications of the instance and these implications are also assigned corresponding locations. However, the implications are not immediately put on the stack. Rather, they are added to the stack when they are reached in the instance order (even though they may have been already technically placed by being assigned to locations). This is done in order to make sure that all possible locations for those implications are also tried during backtracking if required.

Figure 7:
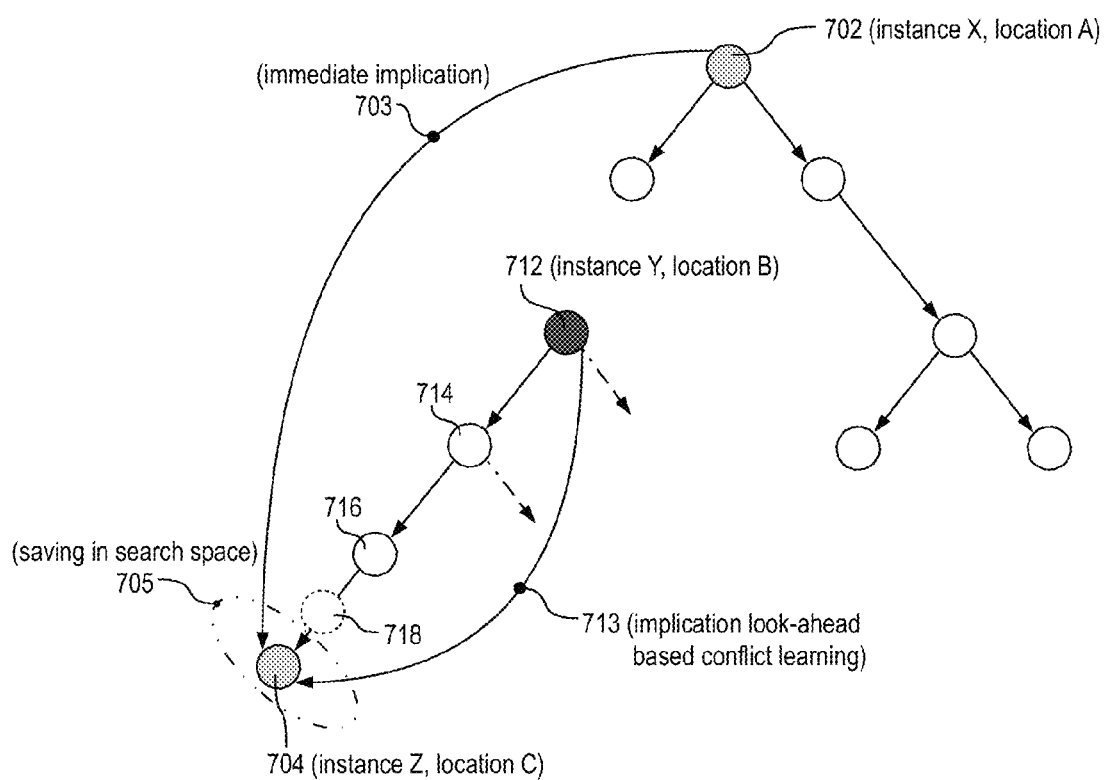
FIG. 7 is a block diagram illustrating implication look-ahead conflict learning according to an example embodiment.

FIG. 7 is a block diagram illustrating implication look-ahead with conflict learning. In FIG. 7, the placer first places instance "X" 702 in location "A". During the placement of instance "X" 702, by operation 703 the placer determines an immediate implication which indicates that instance "Z" 704 is implied instance of instance 702. At this point, the placer assigns instance "Z" 704 to location "C" and saves that assignment in the search space per operation 705. At some point thereafter, the placer gets around to placing instance "Y" 712 and assigns it to location "B". During the placement of instance "Y" 712, by operation 713 the placer performs an implication look-ahead search with conflict learning. Specifically, by operation 713 the placer determines that instances 714, 716, and 718 are a series of implied instances of instance "Y" 712, and that the last instance in the series (718) needs to be placed in location "C". However, since the search space indicates that location "C" is already assigned (to instance "Z" 704), the placer determines that there is a placement conflict for implied instance 718 and that for this reason the placement of instance "Y" 712 in location "B" is not valid. The placer then proceeds to search for a different location for instance "Y" 712, and foregoes placing (e.g., assigning locations to) the implied instances 714, 716, and 718. In this manner, the implication look-ahead with conflict learning (per operation 713) allows the placer to learn about the placement conflict of instance 718 at the earliest time. Specifically, the earlier placement and immediate implication of instance "X" ensures that while placing instance "Y" and performing implication look-ahead, the conflict at location C will be learned at the earliest and at least a portion of the search tree (e.g., instances 714, 716, 718 and their implied instances, if any) will not have to be processed for placement resulting in faster runtime.

Pre-Search Ordering Heuristics

In some embodiments, the placement techniques described herein provide for three different pre-search ordering heuristics in order to greatly reduce the search complexity and to improve performance. One or more of these heuristics may be used to sort the combined list of movable IO and FFB instances (e.g., per the operations in block 510 of FIG. 5) prior to using a backtracking search to place these instances. These heuristics are described hereinafter.

Heuristic 1.

This heuristic provides for ordering the movable IO and FFB instances based on restrictions before the search begins. One example of such restrictions is the number of locations (fixed-function blocks or IO pins) to which instances (FFB or IO) can be assigned, with a lower number being more restrictive. This implies that highly restrictive FFB instances will possibly be encountered much earlier than the IO instances which are associated with these FFB instances. If implication look-ahead is not performed, a placement decision has to wait until all the IO instances of the previously placed FFB instances are processed. If they turn out to be infeasible at this point, valuable search time is already wasted. Thus, ordering the movable IO and FFB instances prior to the search in accordance with this heuristic would save search time.

Heuristic 2.

This heuristic provides for ordering the FFB instances based on the restrictions but requires the processing of all movable associated (e.g., implied) IO instances before processing the next FFB instance in the movable (IO and FFB) instance order. This will save valuable search space by learning conflicts much earlier compared with the approach in the previous heuristic.

Heuristic 3.

This heuristic provides for treating a set of FFB instances and their implied IO instances as single entities with multiple location choices in case any member of the set has more than one choice of locations.

Out-of-Order Backtracking Heuristics

In some embodiments, the placement techniques described herein provide for a heuristic to backtrack out-of-order in a pseudo-exhaustive manner in order to reduce search time for hard-to-find-solutions or when no placement solution exists for the movable IO and FFB instances of an electronic design. In various embodiments, this heuristic may be used as part of performing a backtracking search to place movable IO and FFB instances (e.g., per the operations in block 512 in FIG. 5). In some embodiments, this heuristic is used only when prior exhaustive search failed to find a solution within a maximum global backtrack limit.

According to the out-of-order heuristic, the placer (placer logic) keeps track of the number of backtracks at every depth level of the stack. For example, for each instance at each depth level of the stack, the placer may keep this number in a corresponding variable (e.g., "per_instance_backtrack") and may increment this variable every time a backtrack is performed at its corresponding depth level of the stack. When a backtrack is required, the placer jumps to an instance on the stack for which the current number of backtracks (e.g., as reflected in its "per_instance_backtrack" variable) is less than a predefined backtrack threshold (e.g., as stored in a variable "per_instance_backtrack_threshold"). The rationale is that for the instances that were jumped over, the placer has already tried a significant portion of the search space and could not find a solution; thus, it is very likely that the placement solution doesn't exist in that portion of the search space. The placer resets the backtrack threshold (e.g., sets the "per_instance_backtrack_threshold" variable to "0") for the instances that were jumped over, so that when the placer completes the out-of-order backtracking it can again search the space exhaustively for these instances. Further, after the placer completes the out-of-order backtracking, the placer also resets a global backtrack limit (e.g., sets a variable "global_backtrack_limit" to "0") so that it can again do an exhaustive search post out-of-order backtrack. It is noted that when the placer selects an instance to backtrack to, the placer may have to backtrack even further if it finds that the number of tried locations for the selected instance is a certain (possibly predefined) high percentage of the available locations for that instance. It is also noted that this out-of-order heuristic may be used when prior exhaustive search failed to find a solution within the maximum (e.g., global) backtrack limit.

Alternate Embodiments

In some embodiments, the implication look-ahead search can be turned off. In these embodiments, the placer (placer logic) can still perform the backtracking search as described herein and may still provide a satisfactory performance for smaller placement problems. For example, the placer may provide a configurable parameter that turns on and off the implication look-ahead search and a user/designer may select to change this parameter depending on the size and complexity of the placement that needs to be performed for a particular design.

In some embodiments, conflict learning can be turned off. In these embodiments, the placer (placer logic) can still perform the backtracking search as described herein and may still provide a satisfactory performance for smaller placement problems. For example, the placer may provide a configurable parameter that turns on and off the conflict learning and a user/designer may select to change this parameter depending on the size and complexity of the placement that needs to be performed for a particular design.

In some embodiments, out-of-order backtrack can be turned off for smaller placement problems. For example, in these embodiments the placer (placer logic) may provide a configurable parameter that turns on and off the out-of-order backtrack and a user/designer may select to change this parameter depending on the size and complexity of the placement that needs to be performed for a particular design.

In some embodiments, the placement techniques described herein may be used to improve searches employed in ATPG (automated test pattern generation) engines for certain types of problems. For example, a problem may be formulated as a "controllability only ATPG" so that an ATPG engine can be used to solve this problem. Generally, an ATPG tool injects faults in a circuit and tries to justify the value and then, if the faulty-circuit and the fault-free circuit have a difference in value (fault-effect), the ATPG tool tries to propagate the value to an output for observation. In the process of propagation, the ATPG tool has to set certain circuit lines to certain values to be able to propagate the fault effect. Thus, the placement techniques described herein may be applicable to ATPG engines since placing an instance to a location and then justifying all the implications can be reduced to the problem of injecting a value during ATPG to a circuit line and then justifying the value—for example, setting the output of an AND gate to 1, requires both the inputs to be 1. (It is noted that this is the controllability part of ATPG).

In some embodiments, the placement techniques described herein may be used to improve searches employed in SAT engines for certain types of problems. In these embodiments, the problem may be formulated as a "structural SAT" and all the implications/rules can be modeled as CNF formula (conjunction of disjunctions). The placement techniques described herein may be applied by SAT engines to solve such problems if the modeling of a structural SAT problem can be done as follows:

$LOC_{inst}$=true if instance "inst" is assigned to a location "LOC"

i1 can be assigned to X, Y→$X_{i1}$+$Y_{i1}$ i2 can be assigned to Y, Z→$Y_{i2}$+$Z_{i2}$ X can only have one instance assigned to it→$(X_{i1}.!X_{i2})$+$(!X_{i1}.X_{i2})$+$X_{i2}).(!X_{i1}+!X_{i2})$ Y can only have one instance assigned to it→$(Y_{i1}.!Y_{i2})$+$(!Y_{i1}.Y_{i2})$→$(Y_{i1}+Y_{i2}).(!Y_{i1}+!Y_{i2})$ Z can only have one instance assigned to it→$(Z_{i1}.!Z_{i2})$+$(!Z_{i1}.Z_{i2})$→$(Z_{i1}+Z_{i2}).(!Z_{i1}+!Z_{i2})$ Then, applying FFB "f" to location "w" implies that i1 has to be assigned to x, for example:

$(W_f)$→$(X_{i1})$→$(!W_f+X_{i1})$

Finally, a CNF can be created as follows:

$(X_{i1}+Y_{i1}).(Y_{i2}+Z_{i2}).(X_{i1}+X_{i2}).(!X_{i1}+!X_{i2}).(Y_{i1}+Y_{i2}).$
$(!Y_{i1}+!Y_{i2}).(Z_{i1}+Z_{i2}).(!Z_{i1}+!Z_{i2}).(!W_f+X_{i1})$

In some embodiments, the placement techniques described herein may be performed for a programmable chip that comprises multiple fixed-function blocks and a plurality of IO pins, where each one of the multiple fixed-function blocks can be coupled only to a respective subset of the plurality of IO pins. In some aspects of these embodiments, the plurality of IO pins may include eight or more pins, and any particular subset of the plurality of IO pins may include a single pin, two pins, or three pins. Further, in some aspects of these embodiments the multiple fixed-function blocks may include a timer block, a counter block, a pulse-width modulator (PWM) block, and/or a serial communication block (SCB).

In some embodiments, the placement techniques described herein may be performed for a programmable chip that comprises multiple fixed-function blocks and a plurality of IO pins, where each one of the multiple fixed-function blocks can be coupled only to a respective subset of the plurality of IO pins. In these embodiments, in addition to the multiple fixed-function blocks, the programmable chip may comprise an array of digital blocks, where each block of the array can be coupled to any one of the plurality of pins over one or more programmable interconnects—that is, all digital blocks of the programmable array can be coupled to all of the plurality of pins over suitably programmed interconnect(s).

CONCLUSION

The techniques described herein provide for solving the placement problem in an efficient way that factors in the architectural constraints and effectively prunes the solution space for a fast placement solution. For example, in some embodiments, the techniques described herein introduce a novel variant of a backtracking search that handles the inter-dependencies between fixed-function blocks and IO pins, which exist on highly constrained chip architectures, by automatically and simultaneously placing the IO instances and the FFB instances of an electronic design. The techniques described herein also introduce an efficient implication look-ahead search (to reduce the complexity of the backtracking search) and conflict learning in the context of IO and FFB instance placement (to enable early backtracking). The techniques described herein also introduce three different pre-search ordering heuristics to greatly reduce search complexity and to improve the performance of the placer during runtime, as well as heuristics to backtrack out-of-order in a pseudo-exhaustive manner in order to reduce the search time for hard-to-find placement solutions or when no placement solution exists.

Results obtained from one specific embodiment indicate that a placer operating in accordance with the techniques described herein has succeeded in finding valid placements while a conventional placer has failed 90% of the regressions performed for a specific programmable target device.

Various embodiments of the placement techniques described herein may include various operations. These operations may be performed by hardware, software, firmware, or combination(s) thereof. As used herein, the term "coupled to" means connected directly, or connected indirectly through one or more intervening components over switch(es), bus(es), hub(s), and/or programmable interconnect(s). Any of the signals provided through various switches, hubs, and programmable interconnects may be time multiplexed with other signals and provided over one or more common or dedicated buses and/or signal traces. Each of the buses may alternatively include one or more single signal traces, and one or more signal traces may alternatively perform the function of a bus.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
  placing a digital portion of an electronic design for a programmable chip, wherein the programmable chip comprises multiple fixed-function blocks and a plurality of pins, wherein each one of the multiple fixed-function blocks can be coupled only to a respective subset of the plurality of pins, and wherein placing the digital portion comprises:
    placing a particular fixed-function block (FFB) instance on a particular fixed-function block of the multiple fixed-function blocks;

wherein the particular fixed-function block can be coupled only to a particular subset of the plurality of pins in the programmable chip;

wherein the particular FFB instance is connected to a particular input-output (IO) instance in the electronic design; and placing the particular IO instance on a particular pin from the particular subset of the plurality of pins; wherein placing the particular FFB instance and placing the particular IO instance are performed simultaneously;

wherein placing the digital portion of the electronic design is performed by one or more computer systems.

2. The method of claim 1, wherein placing the digital portion of the electronic design further comprises:

pooling, as a group of instances, a set of FFB instances and a set of IO instances that are connected thereto in the electronic design;

sorting the group of instances; and using a backtracking search to place the group of instances.

3. The method of claim 1, wherein placing the particular FFB instance comprises using a backtracking search to place the particular FFB instance and performing a look-ahead search to determine whether an implied instance, for the particular FFB instance, can be validly placed.

4. The method of claim 3, wherein using the backtracking search to place the particular FFB instance further comprises forgoing placement of at least one instance, which otherwise needs to be placed prior to placing the implied instance, when the look-ahead search determines that the implied instance cannot be validly placed.

5. The method of claim 1 wherein, prior to placing the particular FFB instance and the particular IO instance, placing the digital portion of the electronic design further comprises sorting a set including FFB instances and IO instances in accordance with one or more of:

a first heuristic which specifies that a first FFB instance is to be processed for placement before a second FFB instance when the first FFB instance can be placed on fewer of the multiple fixed-function blocks than the second FFB instance;

a second heuristic which specifies that, when processing a movable FFB instance, any IO instances associated with the movable FFB instance are to be processed for placement before any subsequent FFB instance is processed; and a third heuristic which specifies that members of a subset, which includes one or more FFB instances and any implied IO instances corresponding thereto, are to be treated as single entities with multiple location choices when any member of the subset has more than one location choice for placement.

6. The method of claim 1, wherein placing the particular FFB instance and placing the particular IO instance comprise performing a backtracking search that includes:

pushing a current instance on top of a stack;

if the current instance and any implied instances corresponding thereto can be validly placed, then placing the current instance and marking the current instance as placed; and if the current instance and any implied instances corresponding thereto cannot be validly placed, then backtracking by popping the current instance from the top of the stack and marking as unplaced a previous instance that is on the stack.

7. The method of claim 6, further comprising backtracking out-of-order by performing operations comprising:

keeping track of a number of backtracks performed for each instance at each depth level of the stack; and when backtracking is required, jumping back to a specific instance on the stack for which the number of backtracks is below a backtrack threshold and changing the backtrack threshold for any instances that were jumped over.

8. The method of claim 1, wherein the particular IO instance is an implied instance of the particular FFB instance.

9. The method of claim 1, wherein the particular FFB instance is an implied instance of the particular IO instance.

10. The method of claim 1, wherein the particular IO instance is included in a contiguous set of IO instances and wherein, after the particular IO instance is placed on the particular pin, the method further comprises performing a feasibility check to determine whether the remaining members of the contiguous set can be placed on pins that are contiguous with the particular pin.

11. A non-transitory computer-readable medium storing a set of instructions that comprise instructions which, when executed by one or more processors, cause the one or more processors to perform operations comprising:

placing a digital portion of an electronic design for a programmable chip, wherein the programmable chip comprises multiple fixed-function blocks and a plurality of pins, wherein each one of the multiple fixed-function blocks can be coupled only to a respective subset of the plurality of pins, and wherein placing the digital portion comprises:

placing a particular fixed-function block (FFB) instance on a particular fixed-function block of the multiple fixed-function blocks;

wherein the particular fixed-function block can be coupled only to a particular subset of the plurality of pins in the programmable chip;

wherein the particular FFB instance is connected to a particular input-output (IO) instance in the electronic design; and placing the particular IO instance on a particular pin from the particular subset of the plurality of pins wherein placing the particular FFB instance and placing the particular IO instance are performed simultaneously.

12. The non-transitory computer-readable medium of claim 11, wherein the instructions that cause placing the digital portion of the electronic design further comprise instructions which, when executed by the one or more processors, cause the one or more processors to perform:

pooling, as a group of instances, a set of FFB instances and a set of IO instances that are connected thereto in the electronic design;

sorting the group of instances; and using a backtracking search to place the group of instances.

13. The non-transitory computer-readable medium of claim 11, wherein the instructions that cause placing the particular FFB instance comprise instructions which, when executed by the one or more processors, cause the one or more processors to perform a backtracking search to place the particular FFB instance and to perform a look-ahead search to determine whether an implied instance, for the particular FFB instance, can be validly placed.

14. The non-transitory computer-readable medium of claim 13, wherein the instructions that cause performing the backtracking search to place the particular FFB instance further comprise instructions which, when executed by the one or more processors, cause the one or more processors to forgo placement of at least one instance, which otherwise needs to be placed prior to placing the implied instance, when the look-ahead search determines that the implied instance cannot be validly placed.

15. The non-transitory computer-readable medium of claim 11, wherein the instructions that cause placing the digital portion of the electronic design further comprise instructions which, when executed by the one or more processors prior to placing the particular FFB instance and the particular IO instance, cause the one or more processors to sort a set including FFB instances and IO instances in accordance with one or more of:

a first heuristic which specifies that a first FFB instance is to be processed for placement before a second FFB instance when the first FFB instance can be placed on fewer of the multiple fixed-function blocks than the second FFB instance;

a second heuristic which specifies that, when processing a movable FFB instance, any IO instances associated with the movable FFB instance are to be processed for placement before any subsequent FFB instance is processed; and a third heuristic which specifies that members of a subset, which includes one or more FFB instances and any implied IO instances corresponding thereto, are to be treated as single entities with multiple location choices when any member of the subset has more than one location choice for placement.

16. The non-transitory computer-readable medium of claim 11, wherein the instructions that cause placing the particular FFB instance and placing the particular IO instance comprise instructions which, when executed by the one or more processors, cause the one or more processors to perform a backtracking search that includes:

pushing a current instance on top of a stack;

if the current instance and any implied instances corresponding thereto can be validly placed, then placing the current instance and marking the current instance as placed; and if the current instance and any implied instances corresponding thereto cannot be validly placed, then backtracking by popping the current instance from the top of the stack and marking as unplaced a previous instance that is on the stack.

17. The non-transitory computer-readable medium of claim 16, wherein the instructions that cause performing the backtracking search further comprise instructions which, when executed by the one or more processors, cause the one or more processors to perform backtracking out-of-order that includes:

keeping track of a number of backtracks performed for each instance at each depth level of the stack; and when backtracking is required, jumping back to a specific instance on the stack for which the number of backtracks is below a backtrack threshold and changing the backtrack threshold for any instances that were jumped over.

18. The non-transitory computer-readable medium of claim 11, wherein the particular IO instance is an implied instance of the particular FFB instance.

19. The non-transitory computer-readable medium of claim 11, wherein the particular FFB instance is an implied instance of the particular IO instance.

20. The non-transitory computer-readable medium of claim 11, wherein the particular IO instance is included in a contiguous set of IO instances and wherein the set of instructions further comprises instructions which, when executed by the one or more processors after the particular IO instance is placed on the particular pin, cause the one or more processors to perform a feasibility check to determine whether the remaining members of the contiguous set can be placed on pins that are contiguous with the particular pin.

* * * * *